US012669561B2

(12) United States Patent　　　　(10) Patent No.:　US 12,669,561 B2
Ostawal et al.　　　　　　　　　　　(45) Date of Patent:　Jun. 30, 2026

(54) ACTIVE SHIMMING FOR LOW-FIELD MAGNETIC RESONANCE IMAGING

(71) Applicant: neuro42, Inc., San Francisco, CA (US)

(72) Inventors: Rishabh Ostawal, San Francisco, CA (US); Ghoncheh Amouzandeh, Alameda, CA (US); Haidong Peng, San Francisco, CA (US); Hung-Yu Lin, Walnut Creek, CA (US)

(73) Assignee: neuro42, Inc., San Francisco, CA (US)

( * ) Notice: Subject to any disclaimer, the term of this patent is extended or adjusted under 35 U.S.C. 154(b) by 8 days.

(21) Appl. No.: 18/459,712

(22) Filed: Sep. 1, 2023

(65) Prior Publication Data

US 2025/0076429 A1　　Mar. 6, 2025

(51) Int. Cl.
G01R 33/383　　　(2006.01)
G01R 33/385　　　(2006.01)
　　　(Continued)

(52) U.S. Cl.
CPC ......... G01R 33/383 (2013.01); G01R 33/385 (2013.01); G01R 33/3875 (2013.01); G01R 33/445 (2013.01)

(58) Field of Classification Search
CPC　G01R 33/383; G01R 33/385; G01R 33/3875; G01R 33/445
See application file for complete search history.

(56) References Cited

U.S. PATENT DOCUMENTS 4,899,109 A * 2/1990 Tropp ................. G01R 33/3875
　　　　　　　　　　　　　　　　　　324/319
4,931,733 A * 6/1990 Hanawa ............. G01R 33/3875
　　　　　　　　　　　　　　　　　　324/318
(Continued)

FOREIGN PATENT DOCUMENTS

WO　　WO-2022236308 A1　11/2022
WO　　WO-2024108097 A1　 5/2024
(Continued)

OTHER PUBLICATIONS

Cooley, Clarissa Zimmerman. et al. Design of Sparse Halbach Magnet Arrays for Portable MRI Using a Genetic Algorithm. IEEE Transactions on Magnetics 54(1):5100112, 1-12 (2018). Published online Oct. 23, 2017.

(Continued)

*Primary Examiner* — Daniel R Miller

(74) *Attorney, Agent, or Firm* — Wilson Sonsini Goodrich & Rosati

(57)　　　　　　ABSTRACT

The present disclosure provides various devices, systems, and methods for active shimming for an MRI system. For example, an MRI system can a first gradient coil, a second gradient coil, a third gradient coil, and a permanent magnet. The permanent magnet is configured to generate a magnetic field $B_0$ having a low field strength. A method for active shimming the MRI system can include a set of candidate shimming configurations with first current values associated with the first gradient coil, second current values associated with the second gradient coil, and third current values associated with the third gradient coil. The method further includes applying, for each candidate shimming configuration, a pulse sequence; acquiring, for each pulse sequence, a magnetic resonance (MR) signal; determining, for each MR signal, a signal bandwidth based on a frequency domain of the MR signal; and designating a shimming configuration for the MRI system.

23 Claims, 12 Drawing Sheets

(51) Int. Cl.
    *G01R 33/3875*     (2006.01)
    *G01R 33/44*     (2006.01)

(56)         References Cited

U.S. PATENT DOCUMENTS

| | | | |
|---|---|---|---|
| 6,163,240 A | 12/2000 | Zuk et al. | |
| 6,411,187 B1 * | 6/2002 | Rotem | G01R 33/3806 |
| | | | 335/298 |
| 12,270,867 B2 | 4/2025 | Inglis et al. | |
| 12,332,333 B2 | 6/2025 | Peng | |
| 12,360,193 B2 | 7/2025 | Lin et al. | |
| 2001/0053877 A1 * | 12/2001 | Brand | G01R 33/3875 |
| | | | 600/410 |
| 2005/0107686 A1 * | 5/2005 | Chan | G01R 33/3415 |
| | | | 600/422 |
| 2022/0354378 A1 | 11/2022 | Nacev et al. | |
| 2024/0168105 A1 | 5/2024 | Inglis et al. | |
| 2024/0215849 A1 | 7/2024 | Lin et al. | |
| 2024/0215927 A1 | 7/2024 | Lin | |
| 2024/0219504 A1 | 7/2024 | Lin et al. | |
| 2024/0230804 A1 | 7/2024 | Zou | |
| 2024/0230811 A1 | 7/2024 | Peng | |
| 2024/0293186 A1 | 9/2024 | Hoshyarmanesh et al. | |
| 2025/0060440 A1 | 2/2025 | Fu et al. | |
| 2025/0155524 A1 | 5/2025 | Inglis et al. | |
| 2025/0225628 A1 | 7/2025 | Inglis et al. | |
| 2025/0264559 A1 | 8/2025 | Inglis et al. | |

FOREIGN PATENT DOCUMENTS

| | | |
|---|---|---|
| WO | WO-2024145098 A1 | 7/2024 |
| WO | WO-2024145103 A1 | 7/2024 |
| WO | WO-2024145104 A1 | 7/2024 |
| WO | WO-2024151723 A1 | 7/2024 |
| WO | WO-2024151727 A1 | 7/2024 |
| WO | WO-2024182799 A1 | 9/2024 |
| WO | WO-2025038885 A2 | 2/2025 |
| WO | WO-2025117000 | 6/2025 |
| WO | WO-2025151451 | 7/2025 |
| WO | WO-2025230517 | 11/2025 |
| WO | WO-2025230518 A1 | 11/2025 |

OTHER PUBLICATIONS

PCT/US2024/044543 International Search Report and Written Opinion dated May 7, 2025.

* cited by examiner

570

572 — Generate $B_0$ in region of interest

574 — Apply excitation pulse(s)

576 — Apply gradient field(s)

577 — Detect/Receive RF signals

578 — Reconstruct Image from Spatially-Encoded RF signals

9000

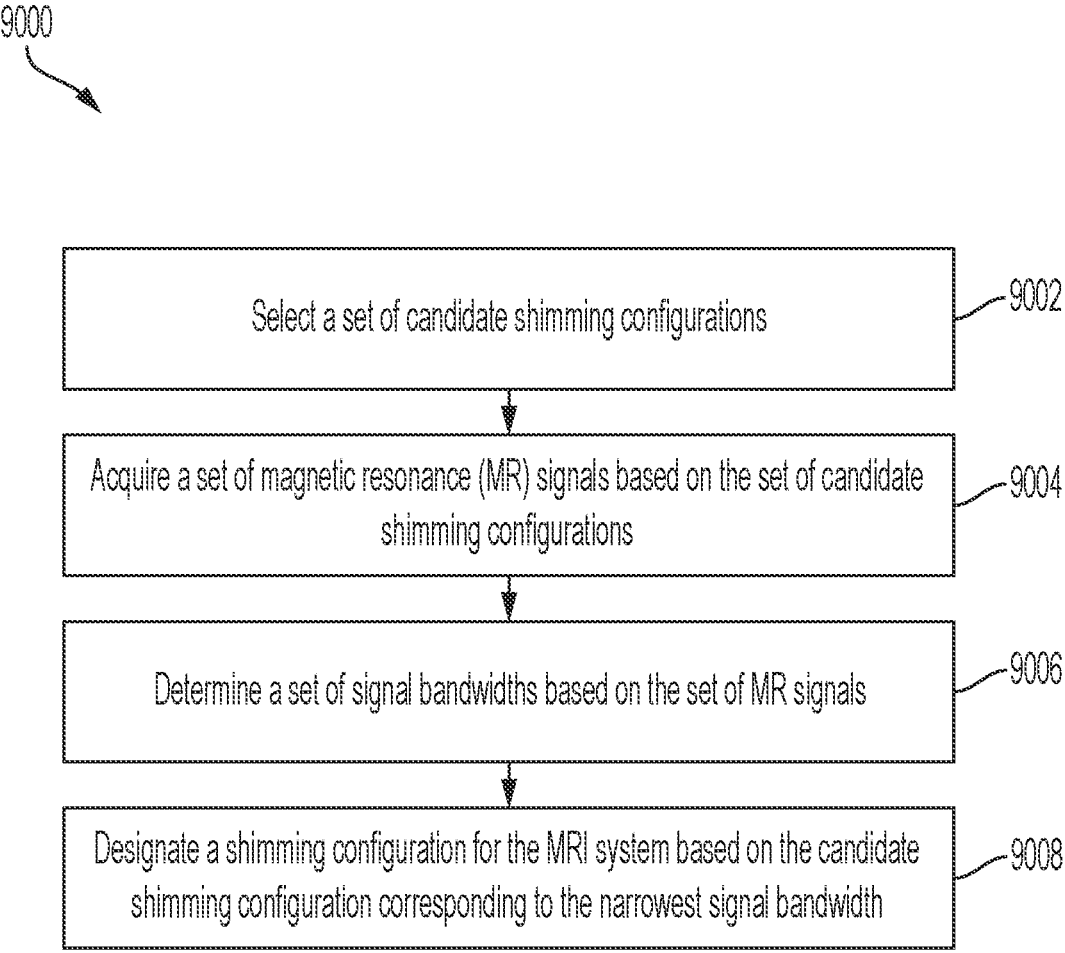

| Select a set of candidate shimming configurations | 9002 |

| Acquire a set of magnetic resonance (MR) signals based on the set of candidate shimming configurations | 9004 |

| Determine a set of signal bandwidths based on the set of MR signals | 9006 |

| Designate a shimming configuration for the MRI system based on the candidate shimming configuration corresponding to the narrowest signal bandwidth | 9008 |

FIG. 9

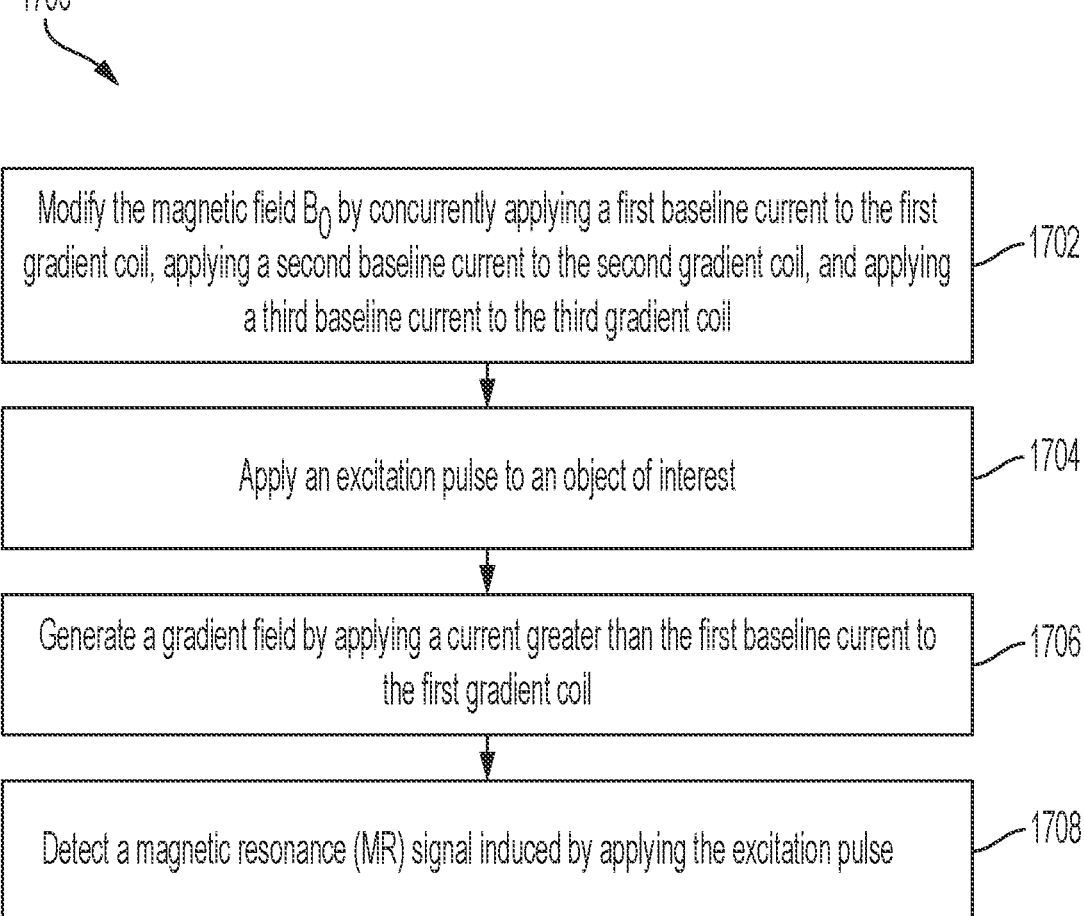

1700

Modify the magnetic field $B_0$ by concurrently applying a first baseline current to the first gradient coil, applying a second baseline current to the second gradient coil, and applying a third baseline current to the third gradient coil — 1702

Apply an excitation pulse to an object of interest — 1704

Generate a gradient field by applying a current greater than the first baseline current to the first gradient coil — 1706

Detect a magnetic resonance (MR) signal induced by applying the excitation pulse — 1708

FIG. 17

ACTIVE SHIMMING FOR LOW-FIELD MAGNETIC RESONANCE IMAGING

BACKGROUND

The present disclosure relates to magnetic resonance imaging (MRI), medical imaging, medical intervention, and surgical intervention. MRI systems often include large and complex machines that generate significantly high magnetic fields and create significant constraints on the feasibility of certain surgical interventions. Restrictions can include limited physical access to the patient by a surgeon and/or a surgical robot and/or limitations on the usage of certain electrical and mechanical components in the vicinity of the MRI scanner. Such limitations are inherent in the underlying design of many existing systems and are difficult to overcome.

SUMMARY

According to one aspect, the present disclosure provides a method of active shimming for a magnet resonance imaging (MRI) system. The MRI system includes a first gradient coil, a second gradient coil, a third gradient coil, and a permanent magnet. The permanent magnet is configured to generate a magnetic field $B_0$ having a low field strength. The method includes selecting a set of candidate shimming configurations. The set of candidate shimming configurations includes first current values associated with the first gradient coil from a first range of current values, second current values associated with the second gradient coil from a second range of current values, and third current values associated with the third gradient coil from a third range of current values. The method further includes applying, for each candidate shimming configuration, a pulse sequence; acquiring, for each pulse sequence, a magnetic resonance (MR) signal; determining, for each MR signal, a signal bandwidth based on a frequency domain of the MR signal; and designating a shimming configuration for the MRI system. The shimming configuration is based on the candidate shimming configuration corresponding to the narrowest signal bandwidth of the MR signals for the set of candidate shimming configurations.

According to another aspect, the present disclosure provides a system. The system includes an array of permanent magnets, a radio frequency (RF) coil assembly, a first gradient coil, a second gradient coil, a third gradient coil, and a control circuit comprising a processor and a memory. The an array of permanent magnets is configured to generate a low-field strength magnetic field $B_0$ toward an object of interest located within a field of view. The RF coil assembly includes an array of RF coils positionable around an object of interest in the field of view configured to acquire magnetic resonance signals. The first gradient coil is configured to modify the magnetic field $B_0$ in a first direction based receiving a first current. The second gradient coil is configured to modify the magnetic field $B_0$ in a second direction based receiving a second current. The third gradient coil is configured to modify the magnetic field $B_0$ in a third direction based receiving a third current. The memory stores instructions executable by the processor to apply the first current, the second current, and the third current according to a predetermined shimming configuration of the system.

According to yet another aspect, the present disclosure provides a method of operating a magnet resonance imaging (MRI) system. The MRI system includes a radiofrequency (RF) coil, a first gradient coil, a second gradient coil, a third gradient coil, and a permanent magnet. The permanent magnet is configured to generate a magnetic field $B_0$ having a low field strength. The method includes modifying the magnetic field $B_0$ by concurrently applying a first baseline current to the first gradient coil, applying a second baseline current to the second gradient coil, and applying a third baseline current to the third gradient coil. The method further includes applying, by the RF coil, an excitation pulse to an object of interest; generating, by the first gradient coil, a gradient field by applying a current greater than the first baseline current to the first gradient coil; and detecting, by the RF coil, a magnetic resonance (MR) signal induced by the applying the excitation pulse.

BRIEF DESCRIPTION OF THE DRAWINGS

The various aspects described herein, both as to organization and methods of operation, together with further objects and advantages thereof, may best be understood by reference to the following description, taken in conjunction with the accompanying drawings as follows.

FIG. 9 is a flow chart describing a method of active shimming for an MRI system, in accordance with at least one aspect of the present disclosure.

FIG. 17 is a flow chart describing a method of operating an MRI system using active shimming, in accordance with at least one aspect of the present disclosure.

Corresponding reference characters indicate corresponding parts throughout the several views. The exemplifications set out herein illustrate various disclosed embodiments, is one form, and such exemplifications are not to be construed as limiting the scope thereof in any manner.

DETAILED DESCRIPTION

Figure 1:
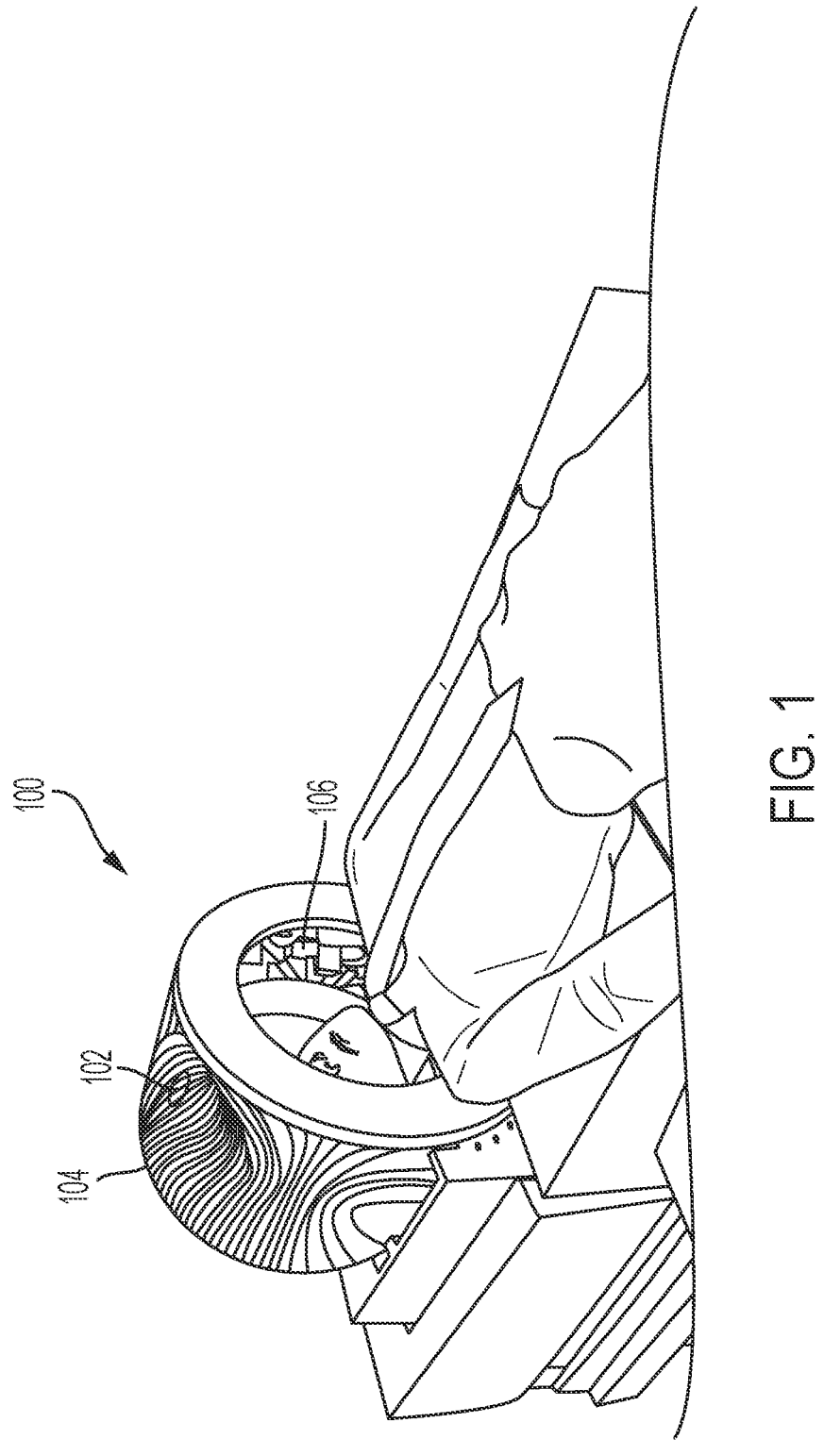
FIG. 1 depicts components of a MRI scanning system including a dome-shaped housing for a magnetic array, the dome-shaped housing surrounding a region of interest therein and further depicting the dome-shaped housing positioned to receive at least a portion of the head of a patient reclined on the table into the region of interest, in accordance with at least one aspect of the present disclosure.

Applicant of the present application also owns the following patent applications, which are each herein incorporated by reference in their respective entireties:

International Patent Application No. PCT/US2022/72143, titled NEURAL INTERVENTIONAL MAGNETIC RESONANCE IMAGING APPARATUS, filed May 5, 2022;

U.S. patent application Ser. No. 18/057,207, titled SYSTEM AND METHOD FOR REMOVING ELECTROMAGNETIC INTERFERENCE FROM LOW-FIELD MAGNETIC RESONANCE IMAGES, filed Nov. 19, 2022;

U.S. patent application Ser. No. 18/147,418, titled MODULARIZED MULTI-PURPOSE MAGNETIC RESONANCE PHANTOM, filed Dec. 28, 2022;

U.S. patent application Ser. No. 18/147,542, titled INTRACRANIAL RADIO FREQUENCY COIL FOR INTRAOPERATIVE MAGNETIC RESONANCE IMAGING, filed Dec. 28, 2022;

U.S. patent application Ser. No. 18/147,556, titled DEEP LEARNING SUPER-RESOLUTION TRAINING FOR ULTRA LOW-FIELD MAGNETIC RESONANCE IMAGING, filed Dec. 28, 2022; and U.S. patent application Ser. No. 18/153,111, titled ACCELERATING MAGNETIC RESONANCE IMAGING USING PARALLEL IMAGING AND ITERATIVE IMAGE RECONSTRUCTION, filed Jan. 11, 2023; and U.S. patent application Ser. No. 18/153,175, titled FAST T2-WEIGHTED AND DIFFUSION-WEIGHTED CHIRPED-CPMG SEQUENCES, filed Jan. 11, 2023;

U.S. Provisional Patent Application No. 63/488,102, titled A METHOD OF MERGING A CO-OPERATIVE MR-COMPATIBLE ROBOT AND A LOW-FIELD PORTABLE MRI SYSTEM, filed Mar. 2, 2023; and U.S. patent application Ser. No. 18/450,010, titled ITERATIVE SHIMMING FOR LOW-FIELD HEAD-OPTIMIZED MRI, filed Aug. 15, 2023.

Before explaining various aspects of interventional magnetic resonance imaging devices in detail, it should be noted that the illustrative examples are not limited in application or use to the details of construction and arrangement of parts illustrated in the accompanying drawings and description. The illustrative examples may be implemented or incorporated in other aspects, variations and modifications, and may be practiced or carried out in various ways. Further, unless otherwise indicated, the terms and expressions employed herein have been chosen for the purpose of describing the illustrative examples for the convenience of the reader and are not for the purpose of limitation thereof. Also, it will be appreciated that one or more of the following-described aspects, expressions of aspects, and/or examples, can be combined with any one or more of the other following-described aspects, expressions of aspects and/or examples.

Various aspects are directed to neural interventional magnetic resonance imaging (MRI) devices that allows for the integration of surgical intervention and guidance with an MRI. This includes granting physical access to the area around the patient as well as access to the patient's head with one or more access apertures. In addition, the neural interventional MRI device may allow for the usage of robotic guidance tools and/or traditional surgical implements. In various instances, a neural interventional MRI can be used intraoperatively to obtain scans of a patient's head and/or brain during a surgical intervention, such as a surgical procedure like a brain biopsy or neurosurgery.

FIG. 1 depicts a MRI scanning system 100 that includes a dome-shaped housing 102 configured to receive a patient's head. The dome-shaped housing 102 can further include at least one access aperture configured to allow access to the patient's head to enable a neural intervention. A space within the dome-shaped housing 102 forms the region of interest for the MRI scanning system 100. Target tissue in the region of interest is subjected to magnetization fields/pulses, as further described herein, to obtain imaging data representative of the target tissue.

For example, a patient can be positioned such that his/her head is positioned within the region of interest within the dome-shaped housing 102. The brain can be positioned entirely within the dome-shaped housing 102. In such instances, to facilitate intracranial interventions (e.g. neurosurgery) in concert with MR imaging, the dome-shaped housing 102 can include one or more apertures that provide access to the brain. Apertures can be spaced apart around the perimeter of the dome-shaped housing.

The MRI scanning system 100 can include an auxiliary cart (see, e.g. auxiliary cart 540 in FIG. 6) that houses certain conventional MRI electrical and electronic components, such as a computer, programmable logic controller, power distribution unit, and amplifiers, for example. The MRI scanning system 100 can also include a magnet cart that holds the dome-shaped housing 102, gradient coil(s), and/or a transmission coil, as further described herein. Additionally, the magnet cart can be attached to a receive coil in various instances. Referring primarily to FIG. 1, the dome-shaped housing 102 can further include RF transmission coils, gradient coils 104 (depicted on the exterior thereof), and shim magnets 106 (depicted on the interior thereof). Alternative configurations for the gradient coil(s) 104 and/or shim magnets 106 are also contemplated. In various instances, the shim magnets 106 can be adjustably positioned in a shim tray within the dome-shaped housing 102, which can allow a technician to granularly configure the magnetic flux density of the dome-shaped housing 102.

Various structural housings for receiving the patient's head and enabling neural interventions can be utilized with a MRI scanning system, such as the MRI scanning system 100. In one aspect, the MRI scanning system 100 may be outfitted with an alternative housing, such as a dome-shaped housing 202 (FIG. 2) or a two-part housing 302 (FIG. 3) configured to form a dome-shape. The dome-shaped housing 202 defines a plurality of access apertures 203; the two-part housing 302 also defines a plurality of access apertures 303 and further includes an adjustable gap 305 between the two parts of the housing.

Figures 2, 3:
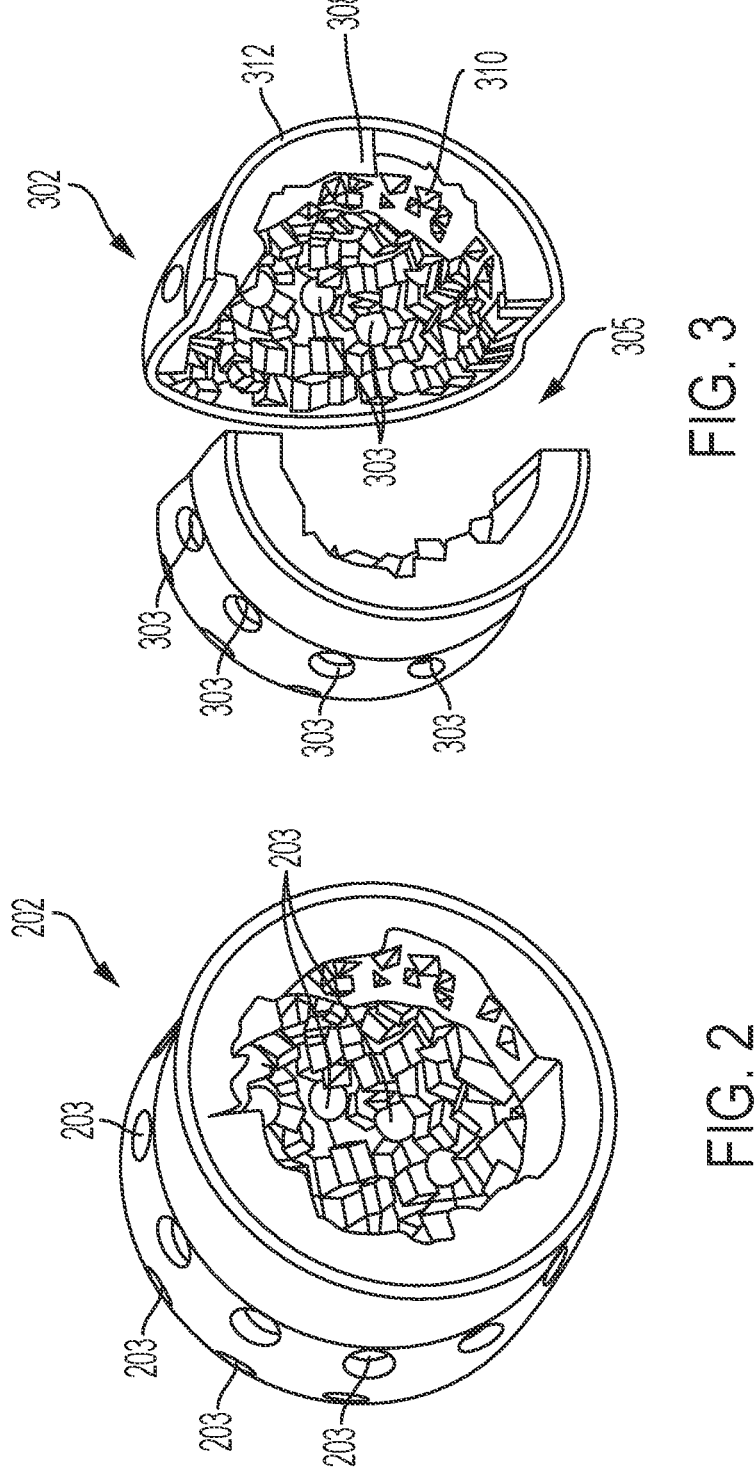
FIG. 2 is a perspective view of an alternative dome-shaped housing for a magnetic array for use with the MRI scanning system of FIG. 1, wherein access apertures are defined in the dome-shaped housing, in accordance with at least one aspect of the present disclosure.
FIG. 3 is a perspective view of an alternative dome-shaped housing for a magnetic array for use with the MRI scanning system of FIG. 1, wherein access apertures and an adjustable gap is defined in the dome-shaped housing, in accordance with at least one aspect of the present disclosure.

In various instances, the housings 202 and 302 can include a bonding agent 308, such as an epoxy resin, for example, that holds a plurality of magnetic elements 310 in fixed positions. The plurality of magnetic elements 310 can be bonded to a structural housing 312, such as a plastic substrate, for example. In various aspects, the bonding agent 308 and structural housing 312 may be non-conductive or diamagnetic materials. Referring primarily to FIG. 3, the two-part housing 302 comprises two structural housings 312. In various aspect, a structural housing for receiving the patient's head can be formed from more than two sub-parts. The access apertures 303 in the structural housing 312 provide a passage directly to the patient's head and are not obstructed by the structural housing 312, bonding agent 308, or magnetic elements 310. The access apertures 303 can be positioned in an open space of the housing 302, for example.

There are many possible configurations of neural interventional MRI devices that can achieve improved access for surgical intervention. Many configurations build upon two main designs, commonly known as the Halbach cylinder and the Halbach dome described in the following article: Cooley et al. (e.g. Cooley, C. Z., Haskell, M. W., Cauley, S. F., Sappo, C., Lapierre, C. D., Ha, C. G., Stockmann, J. P., & Wald, L. L. (2018). Design of sparse Halbach magnet arrays for portable MRI using a genetic algorithm. *IEEE transactions on magnetics*, 54(1), 5100112. The article "Design of sparse Halbach magnet arrays for portable MRI using a genetic algorithm" by Cooley et al., published in *IEEE transactions on magnetics*, 54(1), 5100112 in 2018, is incorporated by reference herein in its entirety.

In various instances, a dome-shaped housing for an MRI scanning system, such as the system 100, for example, can include a Halbach dome defining a dome shape and configured based on several factors including main magnetic field $B_0$ strength, field size, field homogeneity, device size, device weight, and access to the patient for neural intervention. In various aspects, the Halbach dome comprises an exterior radius and interior radius at the base of the dome. The Halbach dome may comprise an elongated cylindrical portion that extends from the base of the dome. In one aspect, the elongated cylindrical portion comprises the same exterior radius and interior radius as the base of the dome and continues from the base of the dome at a predetermined length, at a constant radius. In another aspect, the elongated cylindrical portion comprises a different exterior radius and interior radius than the base of the dome (see e.g. FIGS. 2 and 3). In such instances, the different exterior radius and interior radius of the elongated cylindrical portion can merge with the base radii in a transitional region.

Figure 4:
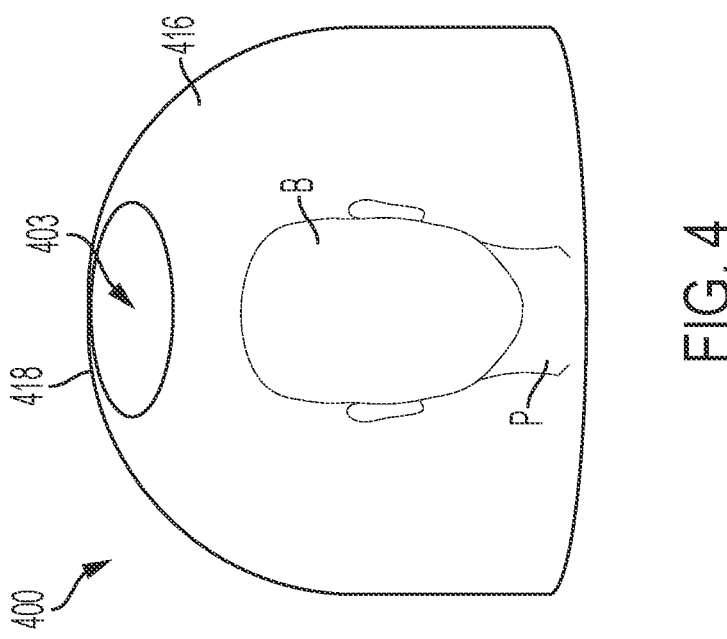
FIG. 4 depicts a dome-shaped housing for use with a MRI scanning system having an access aperture in the form of a centrally-defined hole, in accordance with at least one aspect of the present disclosure.

FIG. 4 illustrates an exemplary Halbach dome 400 for an MRI scanning system, such as the system 100, for example, which defines an access aperture in the form of a hole or access aperture 403, where the dome 400 is configured to receive a head and brain B of the patient P within the region of interest therein, and the access aperture 403 is configured to allow access to the patient P to enable neural intervention with a medical instrument and/or robotically-controlled surgical tool, in accordance with at least one aspect of the present disclosure. The Halbach dome 400 can be built with a single access aperture 403 at the top side 418 of the dome 400, which allows for access to the top of the skull while minimizing the impact to the magnetic field. Additionally or alternatively, the dome 300 can be configured with multiple access apertures around the structure 416 of the dome 400, as shown in FIGS. 2 and 3.

The diameter $D_{hole}$ of the access aperture 403 may be small (e.g. about 2.54 cm) or very large (substantially the exterior $r_{ext}$ diameter of the dome 400). As the access aperture 403 becomes larger, the dome 400 begins to resemble a Halbach cylinder, for example. The access aperture 403 is not limited to being at the apex of the dome 400. The access aperture 403 can be placed anywhere on the surface or structure 416 of the dome 400. In various instances, the entire dome 400 can be rotated so that the access aperture 403 can be co-located with a desired physical location on the patient P.

Figure 5:
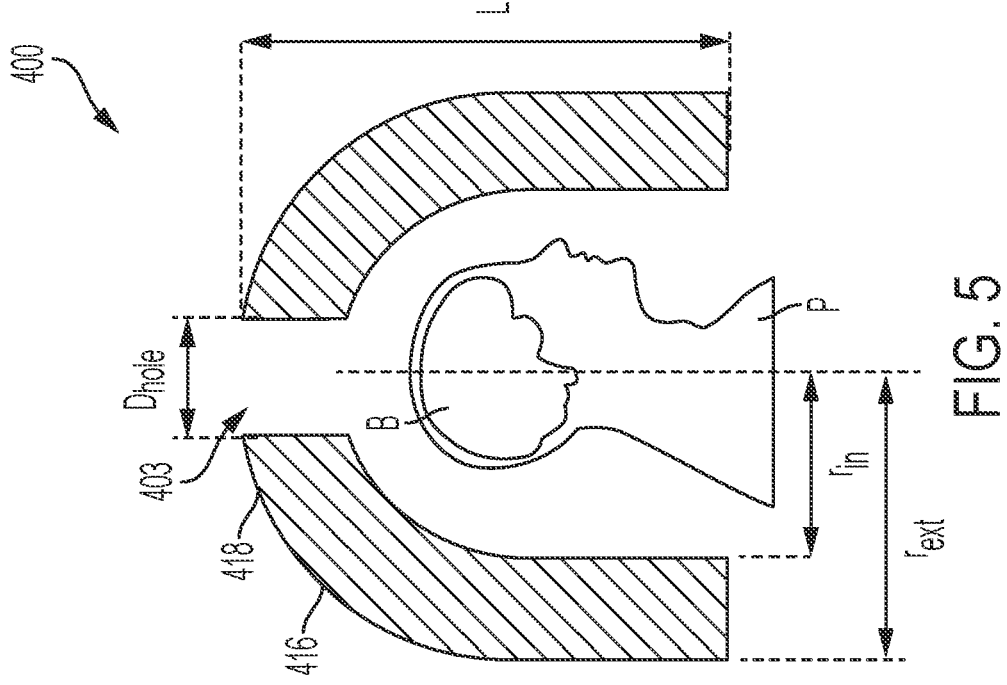
FIG. 5 is a cross-sectional view of the dome-shaped housing of FIG. 4, in accordance with at least one aspect of the present disclosure.

FIG. 5 depicts relative dimensions of the Halbach dome 400, including a diameter Dhole of the access aperture 403, a length L of the dome 400, and an exterior radius $r_{ext}$ and an interior radius $r_{in}$ of the dome 400. The Halbach dome 400 comprises a plurality of magnetic elements that are configured in a Halbach array and make up a magnetic assembly. The plurality of magnetic elements may be enclosed by the exterior radius $r_{ext}$ and interior radius $r_{in}$ in the structure 416 or housing thereof. In one aspect, example dimensions may be defined as: $r_{in}$=19.3 cm; $r_{ext}$=23.6 cm; L=38.7 cm; and 2.54 cm≤D<19.3 cm.

Based on the above example dimensions, a Halbach dome 400 with an access aperture 403 may be configured with a magnetic flux density $B_0$ of around 72 mT, and an overall mass of around 35 kg. It will be appreciated that the dimensions may be selected based on particular applications to achieve a desired magnetic flux density $B_0$, total weight of the Halbach dome 400 and/or magnet cart, and geometry of the neural intervention access aperture 403.

In various aspects, the Halbach dome 400 may be configured to define multiple access apertures 403 placed around the structure 416 of the dome 400. These multiple access apertures 403 may be configured to allow for access to the patient's head and brain B using tools (e.g., surgical tools) and/or a surgical robot.

In various aspects, the access aperture 403 may be adjustable. The adjustable configuration may provide the ability for the access aperture 403 to be adjusted using either a motor, mechanical assist, or a hand powered system with a mechanical iris configuration, for example, to adjust the diameter $D_{hole}$ of the access aperture 403. This would allow for configuration of the dome without an access aperture 403, conducting an imaging scan, and then adjusting the configuration of the dome 400 and mechanical iris thereof to include the access aperture 403 and, thus, to enable a surgical intervention therethrough.

Halbach domes and magnetic arrays thereof for facilitating neural interventions are further described in International Patent Application No. PCT/US2022/72143, titled NEURAL INTERVENTIONAL MAGNETIC RESONANCE IMAGING APPARATUS, filed May 5, 2022, which is incorporated by reference herein in its entirety.

Figure 6:
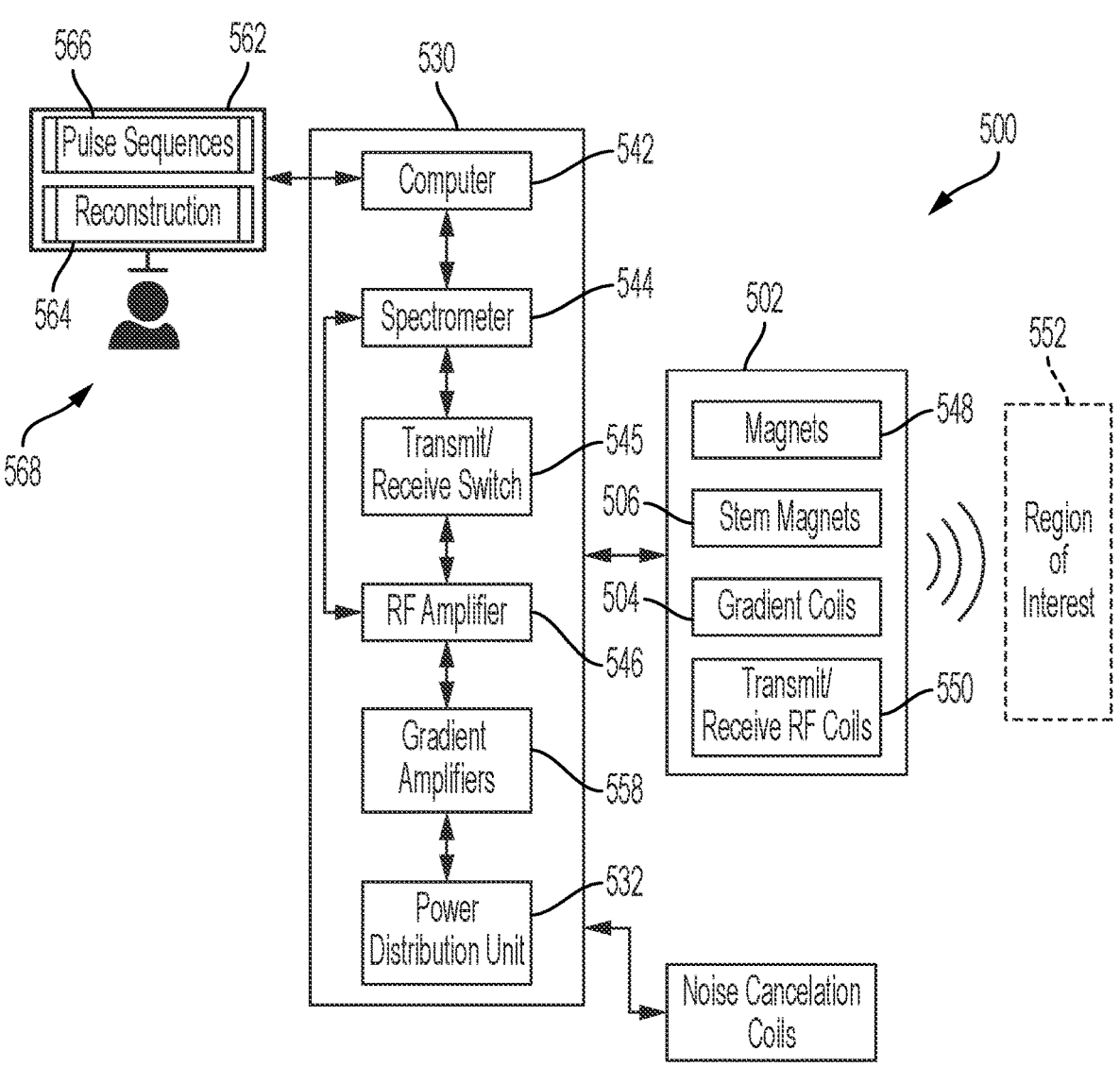
FIG. 6 depicts a control schematic for a MRI system, in accordance with at least one aspect of the present disclosure.

Referring now to FIG. 6, a schematic for an MRI system 500 is shown. The MRI scanning system 100 (FIG. 1) and the various dome-shaped housings and magnetic arrays therefor, which are further described herein, for example, can be incorporated into the MRI system 500, for example. The MRI system 500 includes a housing 502, which can be similar in many aspects to the dome-shaped housings 102 (FIG. 1), 202 (FIG. 2), and/or 302 (FIG. 3), for example. The housing 502 is dome-shaped and configured to form a region of interest, or field of view, 552 therein. For example, the housing 502 can be configured to receive a patient's head in various aspects of the present disclosure.

The housing 502 includes a magnet assembly 548 having a plurality of magnets arranged therein (e.g. a Halbach array of magnets). In various aspect, the main magnetic field $B_0$, generated by the magnetic assembly 548, extends into the field of view 552, which contains an object (e.g. the head of a patient) that is being imaged by the MRI system 500.

The MRI system 500 also includes RF transmit/receive coils 550. The RF transmit/receive coils 550 are combined into integrated transmission-reception (Tx/Rx) coils. In other instances, the RF transmission coil can be separate from the RF reception coil. For example, the RF transmission coil(s) can be incorporated into the housing 502 and the RF reception coil(s) can be positioned within the housing 502 to obtain imaging data.

The housing 502 also includes one or more gradient coils 504, which are configured to generate gradient fields to facilitate imaging of the object in the field of view 552 generated by the magnet assembly 548, e.g., enclosed by the dome-shaped housing and dome-shaped array of magnetic elements therein. Shim trays adapted to receive shim magnets 506 can also be incorporated into the housing 502.

During the imaging process, the main magnetic field $B_0$ extends into the field of view 552. The direction of the effective magnetic field $(B_1)$ changes in response to the RF pulses and associated electromagnetic fields transmitted by the RF transmit/receive coils 550. For example, the RF transmit/receive coils 550 may be configured to selectively transmit RF signals or pulses to an object in the field of view 552, e.g. tissue of a patient's brain. These RF pulses may alter the effective magnetic field experienced by the spins in the sample tissue.

The housing 502 is in signal communication with an auxiliary cart 530, which is configured to provide power to the housing 502 and send/receive control signals to/from the housing 502. The auxiliary cart 530 includes a power distribution unit 532, a computer 542, a spectrometer 544, a transmit/receive switch 545, an RF amplifier 546, and gradient amplifiers 558. In various instances, the housing 502 can be in signal communication with multiple auxiliary carts and each cart can support one or more of the power distribution unit 532, the computer 542, the spectrometer 544, the transmit/receive switch 545, the RF amplifier 546, and/or the gradient amplifiers 558.

The computer 542 is in signal communication with a spectrometer 544 and is configured to send and receive signals between the computer 542 and the spectrometer 544. When the object in the field of view 552 is excited with RF pulses from the RF transmit/receive coils 550, the precession of the object results in an induced electric current, or MR current, which is detected by the RF transmit/receive coils 550 and sent to the RF preamplifier 556. The RF preamplifier 556 is configured to boost or amplify the excitation data signals and send them to the spectrometer 544. The spectrometer 544 is configured to send the excitation data to the computer 542 for storage, analysis, and image construction. The computer 542 is configured to combine multiple stored excitation data signals to create an image, for example. In various instances, the computer 542 is in signal communication with at least one database 562 that stores reconstruction algorithms 564 and/or pulse sequences 566. The computer 542 is configured to utilize the reconstruction algorithms to generate an MR image 568.

From the spectrometer 544, signals can also be relayed to the RF transmit/receive coils 550 in the housing 502 via an RF power amplifier 546 and the transmit/receive switch 545 positioned between the spectrometer 544 and the RF power amplifier 546. From the spectrometer 544, signals can also be relayed to the gradient coils 560 in the housing 502 via a gradient power amplifier 558. For example, the RF power amplifier 546 is configured to amplify the signal and send it to RF transmission coils 560, and the gradient power amplifier 558 is configured to amplify the gradient coil signal and send it to the gradient coils 560.

In various instances, the MRI system 500 can include noise cancellation coils 554. For example, the auxiliary cart 530 and/or computer 542 can be in signal communication with noise cancellation coils 554. In other instances, the noise cancellation coils 554 can be optional. For example, certain MRI systems disclosed herein may not include supplemental/auxiliary RF coils for detecting and canceling electromagnetic interference, i.e. noise.

Figure 7:
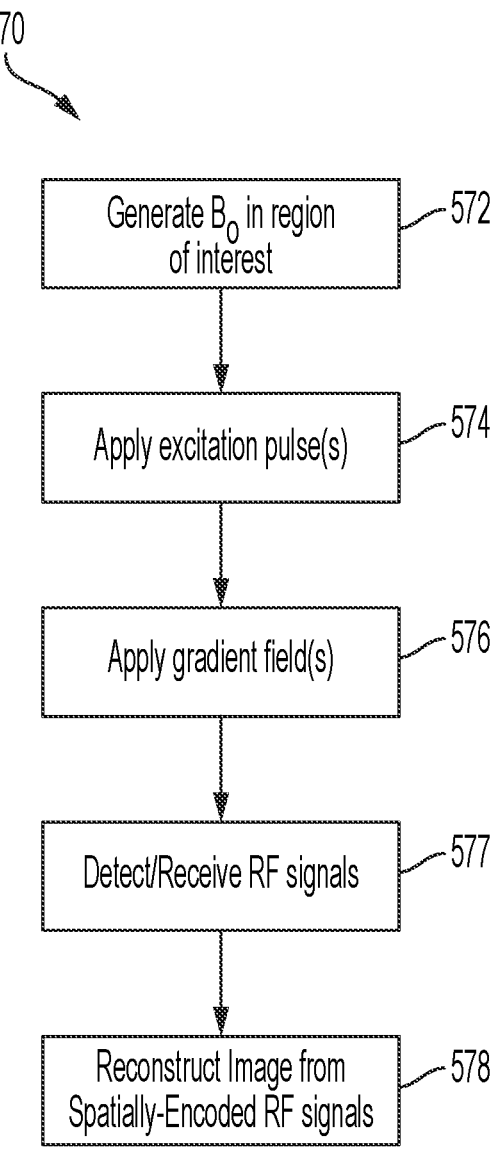
FIG. 7 is a flowchart describing a method for obtaining imaging data from an MRI system, in accordance with at least one aspect of the present disclosure.

A flowchart depicting a process 570 for obtaining an MRI image is shown in FIG. 7. The flowchart can be implemented by the MRI system 500, for example. In various instances, at block 572, the target subject (e.g. a portion of a patient's anatomy), is positioned in a main magnetic field $B_0$ in an interest of region (e.g. region of interest 552), such as within the dome-shaped housing of the various MRI scanners further described herein (e.g. magnet assembly 548). The main magnetic field $B_0$ is configured to magnetically polarize the hydrogen protons (1H-protons) of the target subject (e.g. all organs and tissues) and is known as the net longitudinal magnetization Mo. It is proportional to the proton density (PD) of the tissue and develops exponentially in time with a time constant known as the longitudinal relaxation time T1 of the tissue. T1 values of individual tissues depend on a number of factors including their microscopic structure, on the water and/or lipid content, and the strength of the polarizing magnetic field, for example. For these reasons, the T1 value of a given tissue sample is dependent on age and state of health.

At block 574, a time varying oscillatory magnetic field $B_1$, i.e. an excitation pulse, is applied to the magnetically polarized target subject with a RF coil (e.g. RF transmit/receive coil 550). The carrier frequency of the pulsed $B_1$ field is set to the resonance frequency of the 1H-proton, which causes the longitudinal magnetization to flip away from its equilibrium longitudinal direction resulting in a rotated magnetization vector, which in general can have transverse as well as longitudinal magnetization components, depending on the flip angle used. Common $B_1$ pulses include an inversion pulse, or a 180-degree pulse, and a 90-degree pulse. A 180-degree pulse reverses the direction of the 1H-proton's magnetization in the longitudinal axis. A 90-degree pulse rotates the 1H-proton's magnetization by 90 degrees so that the magnetization is in the transverse plane. The MR signals are proportional to the transverse components of the magnetization and are time varying electrical currents that are detected with suitable RF coils. These MR signals decay exponentially in time with a time constant known as the transverse relaxation time T2, which is also dependent on the microscopic tissue structure, water/lipid content, and the strength of the magnetic field used, for example.

At block 576, the MR signals are spatially encoded by exposing the target subject to additional magnetic fields generated by gradient coils (e.g. gradient coils 560), which are known as the gradient fields. The gradient fields, which vary linearly in space, are applied for short periods of time in pulsed form and with spatial variations in each direction. The net result is the generation of a plurality of spatially encoded MR signals, which are detected at block 577, and which can be reconstructed to form MR images depicting slices of the examination subject. A RF reception coil (e.g. RF transmit/receive coil 550) can be configured to detect the spatially-encoded RF signals. Slices may be oriented in the transverse, sagittal, coronal, or any oblique plane.

At block 578, the spatially encoded signals of each slice of the scanned region are digitized and spatially decoded mathematically with a computer reconstruction program (e.g. by computer 542) in order to generate images depicting the internal anatomy of the examination subject. In various instances, the reconstruction program can utilize an (inverse) Fourier transform to back-transforms the spatially-encoded data (k-space data) into geometrically decoded data.

Figure 8:
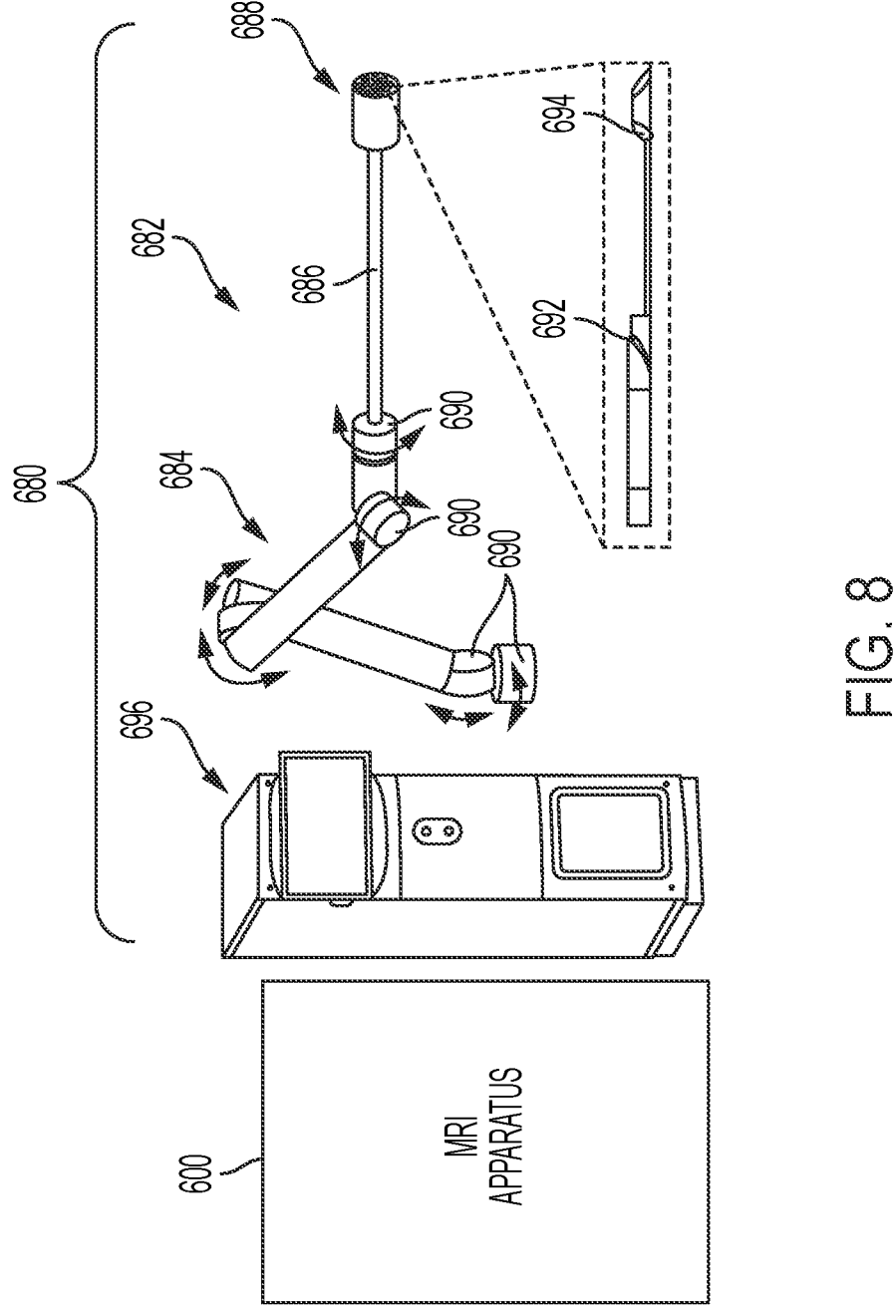
FIG. 8 depicts a MRI scanning system and a robotic system, in accordance with at least one aspect of the present disclosure.

FIG. 8 depicts a graphical illustration of a robotic system 680 that may be used for neural intervention with an MRI scanning system 600. The robotic system 680 includes a computer system 696 and a surgical robot 682. The MRI scanning system 600 can be similar to the MRI system 500 and can include the dome-shaped housing and magnetic arrays having access apertures, as further described herein. For example, the MRI system 500 can include one or more access apertures defined in a Halbach array of magnets in the permanent magnet assembly to provide access to one or more anatomical parts of a patient being imaged during a medical procedure. In various instances, a robotic arm and/or tool of the surgical robot 682 is configured to extend through an access aperture in the permanent magnet assembly to reach a patient or target site. Each access aperture can provide access to the patient and/or surgical site. For example, in instances of multiple access apertures, the multiple access apertures can allow access from different directions and/or proximal locations.

In accordance with various embodiments, the robotic system 680 is configured to be placed outside the MRI system 600. As shown in FIG. 8, the robotic system 680 can include a robotic arm 684 that is configured for movements with one or more degrees of freedom. In accordance with various embodiments, the robotic arm 684 includes one or more mechanical arm portions, including a hollow shaft 686 and an end effector 688. The hollow shaft 686 and end effector 688 are configured to be moved, rotated, and/or swiveled through various ranges of motion via one or more motion controllers 690. The double-headed curved arrows in FIG. 8 signify exemplary rotational motions produced by the motion controllers 690 at the various joints in the robotic arm 684.

In accordance with various embodiments, the robotic arm 684 of the robotic system 682 is configured for accessing various anatomical parts of interest through or around the MRI scanning system 600. In accordance with various embodiments, the access aperture is designed to account for the size of the robotic arm 684. For example, the access aperture defines a circumference that is configured to accommodate the robotic arm 684, the hollow shaft 686, and the end effector 688 therethrough. In various instances, the robotic arm 684 is configured for accessing various anatomical parts of the patient from around a side of the magnetic imaging apparatus 600. The hollow shaft 686 and/or end effector 688 can be adapted to receive a robotic tool 692, such as a biopsy needle having a cutting edge 694 for collecting a biopsy sample from a patient, for example.

The reader will appreciate that the robotic system 682 can be used in combination with various dome-shaped and/or cylindrical magnetic housings further described herein. Moreover, the robotic system 682 and robotic tool 692 in FIG. 8 are exemplary. Alternative robotic systems can be utilized in connection with the various MRI systems disclosed herein. Moreover, handheld surgical instruments and/or additional imaging devices (e.g. an endoscope) and/or systems can also be utilized in connection with the various MRI systems disclosed herein.

In various aspects of the present disclosure, the MRI systems described herein can comprise low field MRI (LF-MRI) systems. In such instances, the main magnetic field $B_0$ generated by the permanent magnet assembly can less than or equal to 1.0 T, such as be between 0.1 T and 1.0 T, for example. In some instances, the MRI systems described herein, such as the LF-MRI systems, can comprise ultra-low field MRI (ULF-MRI) systems. In such instances, the main magnetic field $B_0$ generated by the permanent magnet assembly can be less than or equal to 0.1 T, such as between 0.03 T and 0.1 T, for example.

Higher magnetic fields, such as magnetic fields above 1.0 T, for example, can preclude the use of certain electrical and mechanical components in the vicinity of the MRI scanner. For example, the existence of surgical instruments and/or surgical robot components comprising metal, specially ferrous metals, can be dangerous in the vicinity of higher magnetic fields because such tools can be drawn toward the source of magnetization. Moreover, higher magnetic fields often require specifically-designed rooms with additional precautions and shielding to limit magnetic interference. Despite the limitations on high field MRI systems, low field and ultra-low field MRI systems present various challenges to the acquisition of high quality images with sufficient resolution for achieving the desired imaging objectives.

LF- and ULF-MRI systems generally define an overall magnetic field homogeneity that is relatively poor in comparison to higher field MRI systems. For example, a dome-shaped housing for an array of magnets, as further described herein, can comprise a Halbach array of permanent magnets, which generate a magnetic field $B_0$ having a homogeneity between 1,000 ppm and 10,000 ppm in the region of interest in various aspects of the present disclosure.

Various shimming techniques are often employed with MRI systems in order to improve the homogeneity of the main magnetic field $B_0$. Improving the homogeneity of the main magnetic field $B_0$ can result in slower MR signal decay times and ultimately improve overall image quality.

High field MRI (HF-MRI) systems, such as MRI systems employing superconducting magnets capable of generating magnetic fields above 1.0 T, often utilize passive and/or active shimming techniques. Passive shimming generally involves selectively placing ferromagnetic objects within the MRI system scanning bore to modify the main magnetic field $B_0$ for improved field homogeneity. Active shimming generally involves passing a current through a specialized coil of the MRI system to generate a magnetic field that modifies the main magnetic field $B_0$ for improved field homogeneity. For example, many HF-MRI systems include a dedicated set of superconducting shimming coils (e.g., separate from the gradient coils) for active shimming.

LF-MRI systems may utilize passive shimming techniques. However, LF-MRI systems may be unable to implement the active shimming techniques employed by HF-MRI systems due to various challenges. For example, as mentioned above, HF-MRI systems typically include a dedicated set of shimming coils. Each of the shimming coils in HF-MRI systems can be capable of producing a magnetic field that varies in a uniform and linear manner across a particular region of interest. The effect that shimming coils have on the main magnetic field $B_0$ is relatively predictable for HF-MRI systems. Conversely, LF-MRI systems typically do not have dedicated coils for active shimming. Furthermore, although LF-MRI systems typically do include gradient coils for generating gradient fields during signal acquisition, these gradient fields can be much less uniform and vary in a more non-liner manner compared to the fields generated by the superconducting shimming coils of HF-MRI systems. Thus, the effect that the gradient coils have on homogeneity of the main magnetic field $B_0$ in LF-MRI systems can be relatively unpredictable. This unpredictability can be further compounded by activating the gradient coils concurrently, effectively stacking the effects of the non-linear gradient fields generated by each gradient coil to modify the main magnetic field $B_0$.

In several aspects, the present disclosure provides methods of active shimming for LF-MRI systems. In at least one aspect, a method of active shimming for an LF-MRI system can utilize the system's gradient coils for additional shimming functionality. For example, the method can include selecting a set of candidate shimming configurations for the gradient coils. Each of the candidate shimming configurations can define a different combination of current values that are respectively applied to each of the gradient coils. The method can further include testing each of the candidate shimming configurations to identify which candidate shimming configurations improve the homogeneity of the main magnetic field $B_0$ and/or identify and evaluate the amount or degree of improvement provided by each candidate shimming configuration.

To implement a desired candidate shimming configuration (e.g., the candidate shimming configuration providing the most improved main magnetic field $B_0$ homogeneity) during image acquisition, a baseline current can be applied to each of the gradient coils according to the current values of the desired candidate shimming. Any gradient field required by the image acquisition can be effected by applying a current to the gradient coil(s) at a value that is incrementally greater than the corresponding baseline current(s). Thus, the methods of active shimming disclosed herein can be applied using the existing gradient coils of LF-MRI systems, while still enabling the existing gradient coils to be used to generate imaging gradients. In such instances, separate coils dedicated to active shimming are not required.

In some aspects, the methods of active shimming disclosed herein can be employed using an LF-MRI system that includes three gradient coils. For example, the LF-MRI system can include a first gradient coil for generating a gradient field along first direction (e.g., along an x-axis that is transverse to the direction of the main magnetic field $B_0$), a second gradient coil for generating a gradient field along second direction (e.g., along a y-axis that is transverse to the direction of the main magnetic field $B_0$), and a third gradient coil for generating a gradient field along third direction (e.g., along a z-axis aligned with the direction of the main magnetic field $B_0$). Each of the candidate shimming configurations can include a different combination of current values applied to the first, second, and third gradient coils.

In some aspects, the methods of active shimming disclosed herein can include testing the candidate shimming configurations by directly measuring the effect that each candidate configuration has on the homogeneity of the main magnetic field $B_0$, for example, using a Tesla Meter. In other aspects, the methods of active shimming disclosed herein can included testing the candidate shimming configurations by indirectly determining the effect that each candidate configuration has on the homogeneity of the main magnetic field $B_0$ with respect to a phantom excited by a pulse sequence For example, an MR signal can be acquired while implementing each candidate configuration. Generally, when converted to the frequency domain, a narrower MR signal bandwidth correlates to a main magnetic field $B_0$ with a greater homogeneity. Thus, the frequency domain bandwidth of the acquired MR signals can be compared to identify the relative effect that the corresponding candidate configurations have on the homogeneity of the main magnetic field $B_0$. For example, the candidate configuration used to acquire an MR signal with the narrowest frequency domain bandwidth may be considered as the candidate configuration providing the greatest improvement to main magnetic field $B_0$ homogeneity.

The methods of active shimming provided by the present disclosure can provide numerous benefits. For example, the methods disclosed herein can enable LF-MRI systems to achieve an improved main magnetic field $B_0$ homogeneity and ultimately an improved image quality compared to existing systems (e.g., systems implementing only passive shimming). Further, by indirectly determining relative changes in field homogeneity based on the frequency domain bandwidth of MR signals acquired while implementing candidate shimming configurations, the methods of active shimming disclosed herein can be used to quickly and efficiently identify viable candidate shimming configurations (e.g., compared to methods involving directly measuring field homogeneity). Yet further, by testing a plurality of different candidate shimming configurations (e.g., via a brute force sampling strategy), the methods of active shimming disclosed herein can provide a solution to the above-mentioned problems related to the unpredictable effect that non-linear gradients fields generated by LF-MRI gradient coils can have on the main magnetic field $B_0$.

FIG. 9 is a flow chart describing a method 9000 of active shimming for an MRI system, in accordance with at least one aspect of the present disclosure. In certain instances, the active shimming method 9000 can be used in combination with one or more passive shimming methods, as well. The method 9000 can be carried out using a LF-MRI system, such as, for example, the MRI system 500 described herein with respect to FIG. 6. As noted above, the MRI system 500 can include a magnet assembly 548 having a plurality of magnets arranged therein (e.g. a Halbach array of magnets) for generating a main magnetic field $B_0$ that extends into a region of interest 552, which contains an object (e.g. the head of a patient) that is being imaged by the MRI system 500. The MRI system 500 also includes one or more gradient coils 504, which are configured to generate gradient fields in response to having a current passed therethrough to facilitate imaging of the object in the field of view 552.

Referring again primarily to FIG. 9, and also to FIG. 6, according to the method 9000, a set of candidate shimming configurations is selected 9002. Each candidate shimming configuration of the set of candidate shimming configurations can include a current value for each of the gradient coils 504 (e.g., a current setting in amperes for applying current to each of the gradient coils). For example, the gradient coils 504 may include a first gradient coil for generating a gradient field along first direction (e.g., along an x-axis), a second gradient coil for generating a gradient field along second direction (e.g., along a y-axis), and a third gradient coil for generating a gradient field along third direction (e.g., along a z-axis). Each candidate shimming configuration can include a current value for the first gradient coil, the second gradient coil, and the third gradient coil.

According to some aspects of the method 900, selecting 9002 the set of candidate shimming configurations can include selecting a set of first current values that span a first range, a set of second current values that span a second range, and a set of third current values that span a third range. The set of first current values can correspond to the first gradient coil, the set of second current values can correspond to the second gradient coil, and the set of third current values can correspond to the third gradient coil. The set of candidate shimming configurations can be determined based on the various combinations of current values that can be derived by selecting one of the first current values, one of the second current values, and one of the third current values.

Figure 10:
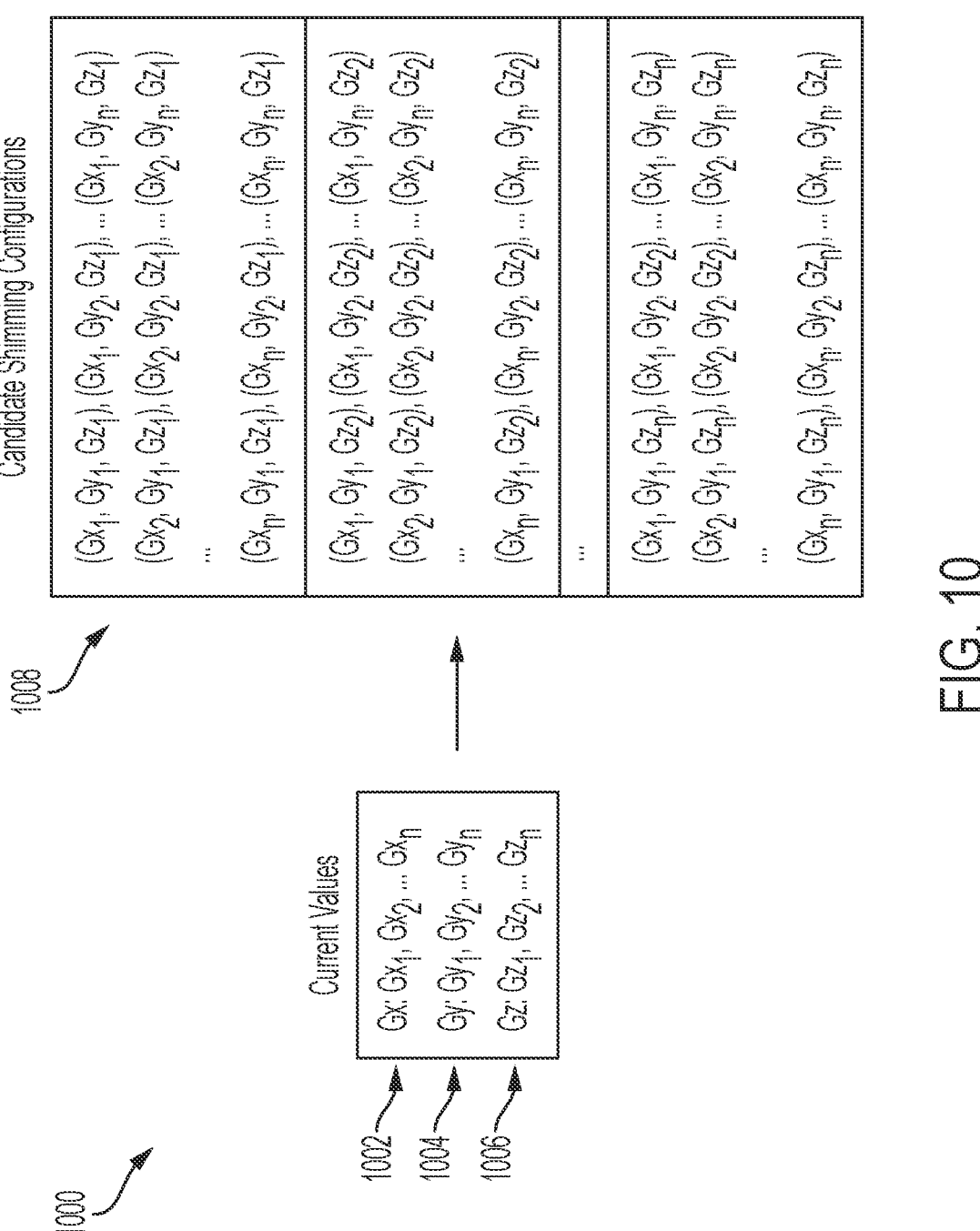
FIG. 10 illustrates an example sampling strategy for selecting candidate shimming configurations, in accordance with at least one aspect of the present disclosure.

For example, FIG. 10 illustrates an example sampling strategy that may be used to select 9002 the set of candidate shimming configurations, in accordance with at least one aspect of the present disclosure. The set of first current values 1002 for a first gradient coil Gx spans a range of current values $Gx_1$ to $Gx_n$ and includes current values $Gx_1$, $Gx_2$, . . . $Gx_n$ spaced according to a designated interval across the range. The set of second of current values 1004 for a second gradient coil Gy spans a range of current values $Gy_1$ to $Gy_n$ and includes current values $Gy_1$, $Gy_2$, . . . $Gy_n$ spaced according to a designated interval across the range. The set of third current values 1006 for a third gradient coil Gz spans a range of current values $Gz_1$ to $Gz_n$ and includes current values $Gz_1$, $Gz_2$, . . . $Gz_n$ spaced according to a designated interval across the range. As shown by FIG. 10, a set of candidate shimming configurations 1008 can be derived based on the set of first current values 1002, the set of second current values 1004, and the set of third current values 1006 by forming every possible combination of current values that can be applied to the first gradient coil Gx, the second gradient coil Gy, and the third gradient coil Gz. Thus, the set of candidate shimming configurations selected 9002 according to the method 9000 can include a large number of candidate shimming configurations that cover a range of currents to be applied to each gradient coil in various combinations.

Referring again primarily to FIG. 9, and also to FIG. 6, according to the method 9000, a set of magnetic resonance (MR) signals is acquired 9004 based on the set of candidate shimming configurations. For example, in one aspect, a single MR signal can be acquired for each candidate shimming configuration by applying current to the gradient coils 504 according to the first, second, and third current values designated by the candidate shimming configuration and performing a signal acquisition sequence. In another aspect, two or more different MR signals can be acquired (e.g., via two separate sequences) for each candidate shimming configuration. The two or more different MR signals may be used for averaging purposes, as explained further below. In yet another aspect, more than two different MR signal can be acquired for each candidate shimming configuration.

Figure 11:
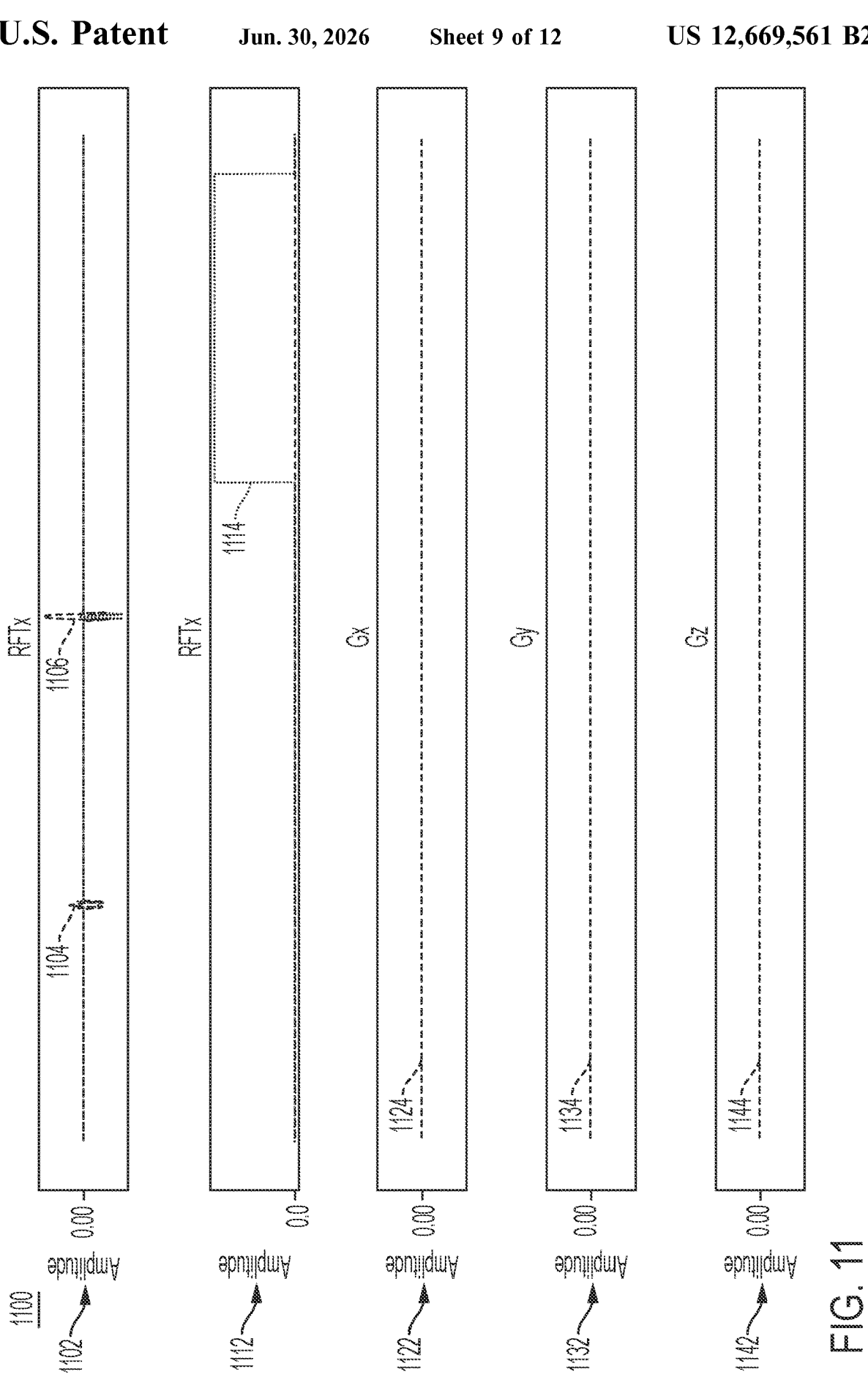
FIG. 11 illustrates an example pulse sequence diagram for acquiring an MR signal for a candidate shimming configuration, in accordance with at least one aspect of the present disclosure.

FIG. 11 illustrates an example sequence diagram 1100 for acquiring an MR signal for a candidate shimming configuration, in accordance with at least one aspect of the present disclosure. The sequence diagram 1102 includes a radio frequency pulse sequence 1102, a signal acquisition sequence 1112, a first gradient coil sequence 1122, a second gradient coil sequence 1132, and a third gradient coil sequence 1142. To acquire the MR signal for the candidate shimming configuration, the gradient sequences 1122, 1132, 1142 are carried out by applying current to the first, second, and third gradient coils (e.g., gradient coils 504) according to a first current value 1124, a second current value 1134, and a third current value 1144, as designated by the first, second, and third current values of the candidate shimming configuration. In the example pulse sequence diagram 1100 of FIG. 11, the current values 1124, 1134, and 1144 are each set to zero corresponding to a candidate shimming configuration with no shimming. Candidate shimming configurations designating a non-zero current value for one or more of the first, second, or third gradient coils may be carried out according to gradient sequences 1122, 1132, 1142 having the first current value 1124, the second current value 1134, and/or the third current value 1144 set to the non-zero current value(s) for at least a portion of the sequence.

Still referring to FIG. 11, the RF pulse sequence 1102 is carried out by applying excitation pulses (e.g., via transmit/receive coils 550 of the MRI system 500) to induce the MR signal. In the non-limiting aspect of FIG. 11, the RF pulse sequence 1102 is a spin echo sequence with a 90 degree excitation pulse 1104 and a 180 degree refocusing pulse 1106 configured induce a spin echo MR signal. As an example, the RF pulse sequence 1102 can define an acquisition time of 0.004 seconds, a repetition time of 0.12 seconds, and pulse durations of 0.0001 seconds for the excitation pulse 1104 and the refocusing pulse 1106. Alternative timeframes are also contemplated. In other aspects, any type of pulse sequence configured to induce an MR signal can be implemented. The acquisition sequence 1112 is carried out by detecting/receiving the MR signal during a signal acquisition window 1114 (e.g., via transmit/receive coils 550 of the MRI system 500). The MR signal acquisition illustrated by the sequence diagram 1100 can repeatedly be carried out, updating the gradient sequences 1122, 1132, 1142 for each candidate shimming configuration, until an MR signal is acquired for each of the candidate shimming configurations. Stated differently, the same pulse sequence can be repeatedly transmitted and applied for each candidate shimming configuration.

Referring again primarily to FIG. 9, and also to FIG. 6, according to the method 9000, a set of signal bandwidths are determined based on the set of acquired MR signals. For example, each signal bandwidth of the set of signal bandwidths can be determined based on a different one of the acquired signals. Each signal bandwidth can be determined by converting the acquired MR signal to the frequency domain and determining a full width half max (FWHM) bandwidth in the frequency domain.

As noted above, two or more than two different MR signals may be acquired for each candidate shimming configuration. Thus, according to some aspects, the signal bandwidth for a given candidate shimming configuration may be determined as an average of the MR signal bandwidths acquired for that candidate shimming configuration. Using an average of the MR signal bandwidths acquired for each candidate shimming configuration can help to eliminate potential outliers in the data and provide a more accurate estimation of the relative effect that the candidate shimming configurations have on the homogeneity of the main magnetic field $B_0$.

As noted above, when converted to the frequency domain, a narrower MR signal bandwidth generally correlates to a main magnetic field $B_0$ with a greater homogeneity. Thus, the frequency domain bandwidth of the acquired MR signals can be compared to identify the relative effect that the corresponding candidate configurations have on the homogeneity of the main magnetic field $B_0$.

Figure 13:
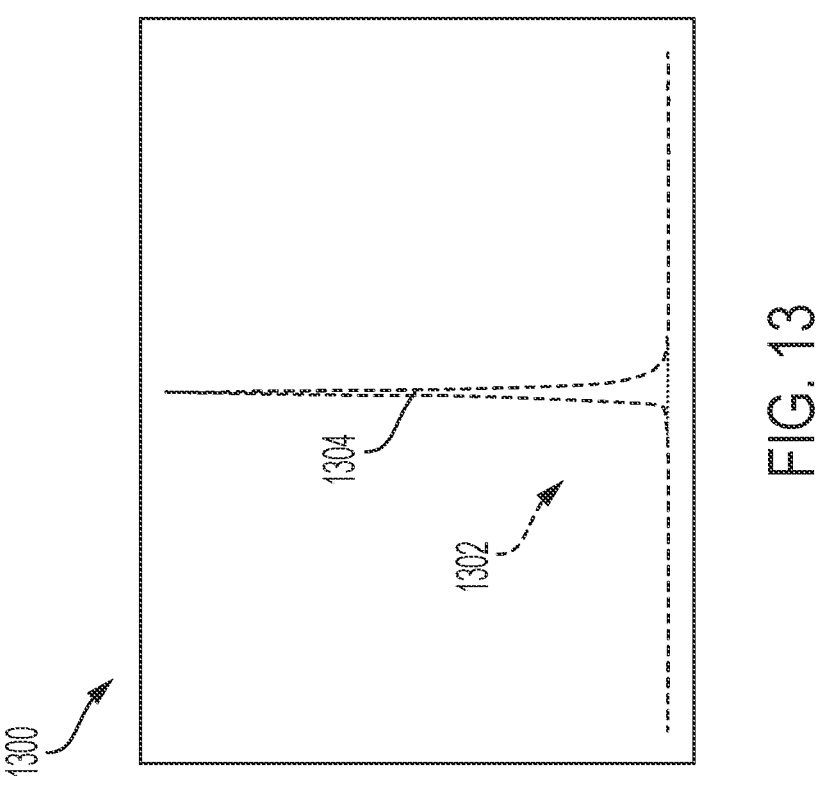
FIG. 13 is a chart illustrating an example frequency spectrum of an MR signal acquired while implementing active shimming.
Figure 12:
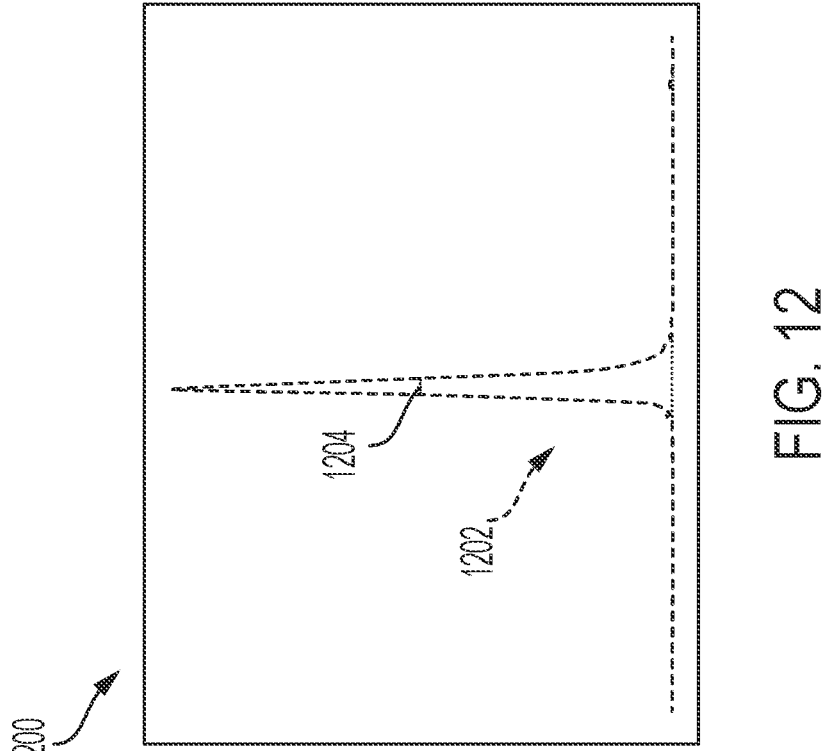
FIG. 12 is a chart illustrating an example frequency spectrum of an MR signal acquired without implementing active shimming.

For example, FIG. 12 is a chart 1200 illustrating an example frequency spectrum 1202 of an MR signal acquired without implementing active shimming and FIG. 13 is a chart 1300 illustrating an example frequency spectrum 1302 of an MR signal acquired while implementing active shimming in accordance with the method 9000 (FIG. 9). By comparing the frequency spectrum 1202 with the frequency spectrum 1302, it is apparent that the FWHM bandwidth 1204 of the frequency spectrum 1202 is wider than the FWHM bandwidth 1304 of the frequency spectrum 1302. Accordingly, this comparison can be used to infer that the shimming configuration implemented while acquiring the MR signal having the frequency spectrum 1302 caused an improvement in the main magnetic field $B_0$ homogeneity compared to the main magnetic field $B_0$ homogeneity that existed (i.e., no active shimming) while acquiring the MR signal having the frequency spectrum 1202.

Referring again primarily to FIG. 9, and also to FIG. 6, according to the method 9000, a shimming configuration for the MRI system (e.g., MRI system 500) can be designated 9008 based on the determined 9006 set of signal bandwidths. Designating 9008 a shimming configuration for the MRI system can include selecting a candidate shimming configuration from the set of candidate shimming configurations and storing the current values (e.g., the first current value, the second current value, the third current value) of the candidate shimming configuration to a memory of the MRI system (e.g., database 562). The stored current values may be set as baseline current values for the gradient coils. For example, from a manufacturing perspective, active shimming may be performed on a phantom for each MRI system that is produced. Further, based on the active shimming, a unique set of baseline current values can be stored to and implemented by each MRI system that is produced. Moreover, throughout the lifespan of the MRI system, the activing shimming method 9000 can be repeated to update the baseline gradient current values and reset the active shimming system of the MRI system.

The baseline current values may be applied anytime an MRI system is used for imaging, with any gradient field required for imaging being implemented by applying current to the gradient coil(s) at a value that is incrementally greater than the baseline value. Where a particular acquisition sequence calls for no gradient to be applied, the MRI system may actually apply an incremental gradient during the imaging sequence according to the stored baseline current value. And where a particular acquisition sequence calls for a gradient to be applied by applying a specific current value, the system may actually apply the gradient according to the sum of the specific current value and the stored baseline current value.

In some aspects, the shimming configuration for the MRI system can be designated 9008 based the candidate shimming configuration corresponding to the narrowest signal bandwidth in the set of signal bandwidths. Thus, the method 9000 may include only a single iteration of candidate shimming configuration selection 9002 and MR signal acquisition 9004.

In other aspects, the method 9000 may include multiple iterations of candidate shimming configuration selection 9002 and MR signal acquisition 9004. For example, the set of signal bandwidths determined 9006 for the initial set of candidate shimming configurations may be used as a basis for selecting 9002 a next set of candidate shimming configurations for a next iteration of the method 9000. This iterative process can be used to fine tune the current values applied to each gradient coil to further improve main magnetic field $B_0$ homogeneity.

In one aspect, to select 9002 the next set of candidate shimming configurations for a next iteration of the method

9000, the initial set of signal bandwidths may be plotted on a three dimensional graph, with the three axes of the graph corresponding to the range selected for the first, second, and third current values from which the initial set of candidate shimming configurations was derived. Areas of the three dimensional (subsets of ranges within the ranges of first, second, and third current values) graph showing the narrowest signal bandwidths may serve as the basis for selecting new ranges of the first, second, and third current values (e.g., as discussed with respect to selecting the ranges for the set of first current values 1002, the set of second current values 1004, and the set of third current values 1006 of FIG. 10) for deriving the next set of candidate shimming configurations. Following the selection 9002 of the next set of candidate shimming configurations, the next iteration of the method 9000 may continue by acquiring 9004 a next set of MR signals based on the next set of candidate shimming configurations and determining 9006 a next set of signal bandwidths based on the next set of MR signals, as described above. This iterative process can continue, for example, until a desired bandwidth threshold is achieved for one of the candidate shimming configurations or until a number of iterations (e.g., 2 iterations, 3 iterations, 4 iterations, etc.) have been completed. A shimming configuration for the MRI system can be designated 9008 based on the candidate shimming configuration corresponding to narrowest signal bandwidth from the last iteration.

FIG. 17 is a flow chart describing a method 1700 of operating an MRI system using active shimming, in accordance with at least one aspect of the present disclosure. The method 9000 can be carried out using a LF-MRI system, such as, for example, the MRI system 500 described herein with respect to FIG. 6. As noted above, the MRI system 500 can include a magnet assembly 548 having a plurality of magnets arranged therein (e.g. a Halbach array of magnets) for generating a main magnetic field $B_0$ that extends into a region of interest 552, which contains an object (e.g. the head of a patient) that is being imaged by the MRI system 500. The MRI system 500 also includes RF transmit/receive coils 550 (e.g. head coil optimized to receive the head of a patient) and one or more gradient coils 504, which can include a first gradient coil, a second gradient coil, and a third gradient coil.

Referring primarily to FIG. 17, and also to FIG. 6, according to the method 1700, the magnetic field $B_0$ is modified 1702 by concurrently applying a first baseline current to the first gradient coil, applying a second baseline current to the second gradient coil, and applying a third baseline current to the third gradient coil. Further, an excitation pulse is applied 1704 to the object by the RF transmit/receive coil(s) 550. A gradient field is generated 1706 by the first gradient coil by applying a current greater than the first baseline current to the first gradient coil. The magnetic resonance (MR) signal that is induced by application of the excitation pulse is detected 1708 by the RF transmit/receive coil(s) 550.

According to at least one aspect of the method 1700, modifying 1702 the magnetic field $B_0$ by concurrently applying the first baseline current to the first gradient coil, applying the second baseline current to the second gradient coil, and applying the third baseline current to the third gradient coil throughout the pulse sequence (i.e. through the repetition time of the pulse sequence) increases homogeneity of the magnetic field $B_0$.

According to at least one aspect of the method 1700, the method 1700 further includes determining the first baseline current, the second baseline current, and the third baseline current. Determining the first baseline current, the second baseline current, and the third baseline current can include selecting a set of candidate shimming configurations, acquiring a set of MR signals based on the set of candidate shimming configurations, determining a set of signal bandwidths based on the set of MR signals, and selecting the first baseline current, the second baseline current, and the third baseline current based on a candidate shimming configuration of the set of candidate shimming configurations corresponding to a narrowest signal bandwidth of the set of signal bandwidths. Each of the candidate shimming configurations can include a first current corresponding to the first gradient coil, a second current corresponding to the second gradient coil, and a third current corresponding to the third gradient coil. Each of the MR signals can correspond to one of the candidate shimming configurations. Each of the signals bandwidths can be determined based on a frequency domain of a corresponding one of the MR signals.

EXAMPLES

Figures 14, 15, 16:
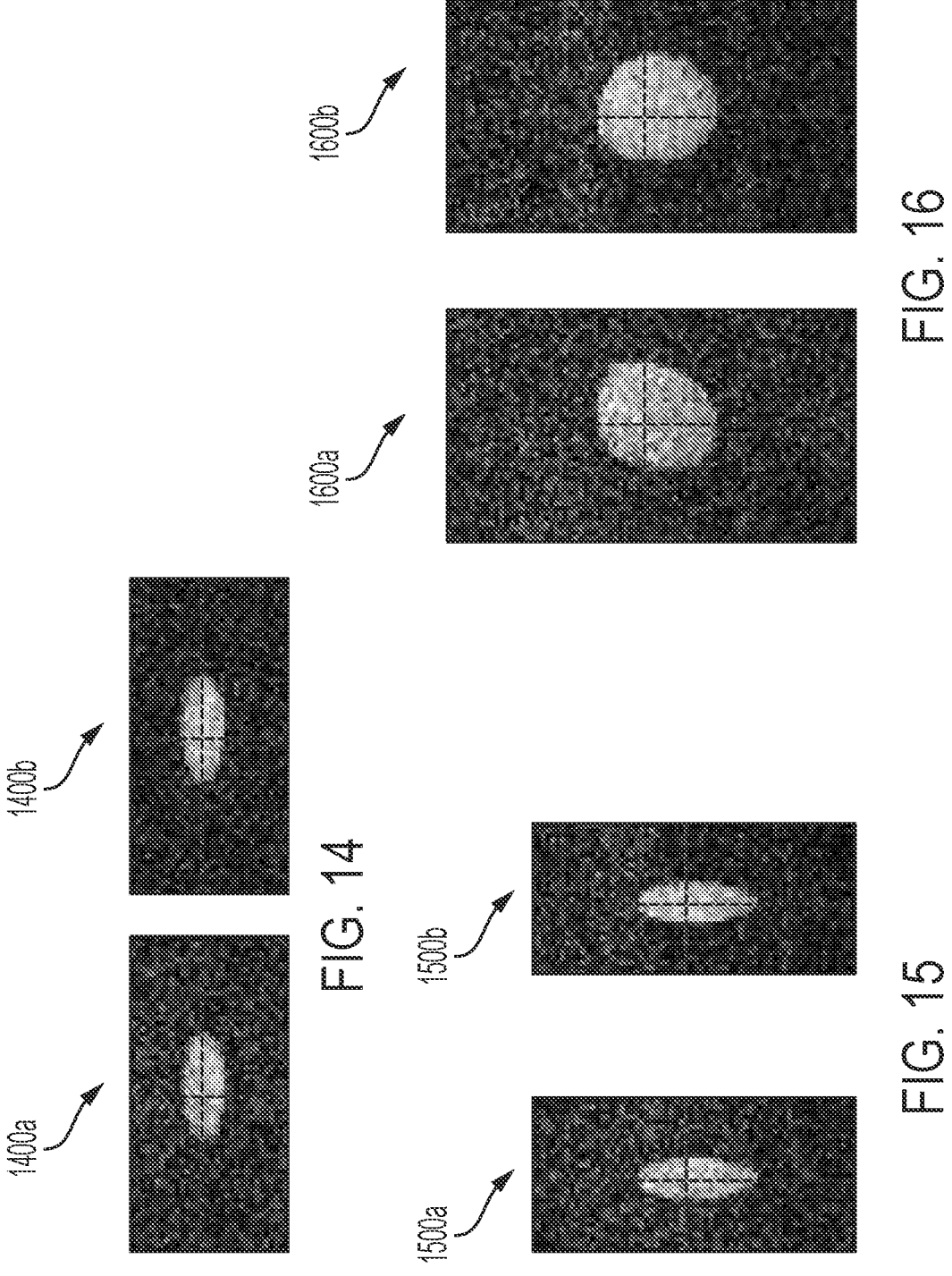
FIG. 14 depicts a comparison of example MR images acquired with and without active shimming.
FIG. 15 depicts a comparison of example MR images acquired with and without active shimming.
FIG. 16 depicts a comparison of example MR images acquired with and without active shimming.

The inventors of the present disclosure have implemented the method 9000 to designate and implement an active shimming confirmation for an LF-MRI system. Each of FIGS. 14, 15, and 16 illustrate a comparison of example MR images acquired with active shimming (image 1400*b*, image 1500*b*, image 1600*b*) and without active shimming (image 1400*a*, image 1500*a*, image 1600*a*). As can be seen in each of FIGS. 14, 15, and 16, the images acquired while implementing active shimming (image 1400*b*, image 1500*b*, image 1600*b*) show decreased geometric distortion compared to the images acquired without active shimming (image 1400*a*, image 1500*a*, image 1600*a*).

CLAUSES

Various additional aspects of the subject matter described herein are set out in the following numbered clauses:

Clause 1: A method of active shimming for a magnet resonance imaging (MRI) system, the MRI system comprising a first gradient coil, a second gradient coil, a third gradient coil, and a permanent magnet, wherein the permanent magnet is configured to generate a magnetic field $B_0$ having a low field strength, the method comprising: selecting a set of candidate shimming configurations, wherein the set of candidate shimming configurations comprises first current values associated with the first gradient coil from a first range of current values, second current values associated with the second gradient coil from a second range of current values, and third current values associated with the third gradient coil from a third range of current values; applying, for each candidate shimming configuration, a pulse sequence; acquiring, for each pulse sequence, a magnetic resonance (MR) signal; determining, for each MR signal, a signal bandwidth based on a frequency domain of the MR signal; and designating a shimming configuration for the MRI system, wherein the shimming configuration is based on the candidate shimming configuration corresponding to the narrowest signal bandwidth of the MR signals for the set of candidate shimming configurations.

Clause 2: The method of Clause 1, further comprising: plotting the signal bandwidths for the set of candidate shimming configurations in a three-dimensional array, wherein the three-dimensional array comprises a first dimension comprising the first current values, a second dimension comprising the second current values, and a third dimension comprising the third current values; and determining the candidate shimming configuration corresponding to the narrowest signal bandwidth of the MR signals for the set of candidate shimming configurations based on the three-dimensional array.

Clause 3. The method of any of Clauses 1-2, wherein the set of candidate shimming configurations is a first set of candidate shimming configurations, the method further comprising: selecting a second set of candidate shimming configurations based on the candidate shimming configuration corresponding to the narrowest signal bandwidth of the MR signals for the first set of candidate shimming configurations.

Clause 4: The method of Clause 3, further comprising: for each candidate shimming configuration of the second set of candidate shimming configurations, applying the pulse sequence, acquiring the MR signal, and determining the signal bandwidth based on the frequency domain of the MR signal; and designating the shimming configuration for the MRI system based on the candidate shimming configuration corresponding to the narrowest signal bandwidth of the MR signals for the second set of candidate shimming configurations.

Clause 5: The method of any of Clauses 3-4, wherein selecting the second set of candidate shimming configurations comprises: selecting a fourth range of current values, a fifth range of current values, and a sixth range of current values based on the candidate shimming configuration corresponding to the narrowest signal bandwidth of the MR signals for the first set of candidate shimming configurations; wherein the second set of candidate shimming configurations comprises fourth current values associated with the first gradient coil from the fourth range of current values, fifth current values associated with the second gradient coil from the fifth range of current values, and sixth current values associated with the third gradient coil from the sixth range of current values.

Clause 6: The method of any of Clauses 1-5, wherein the set of candidate shimming configurations comprises candidate shimming configurations derived based on combining each of the first current values with each of the second current values and each of the third current values.

Clause 7: The method of any of Clauses 1-6, wherein the MRI system comprises a dome-shaped housing comprising a head coil, and wherein acquiring the MR signal comprises acquiring the MR signal induced in a phantom positioned within the head coil.

Clause 8: The method of any of Clauses 1-7, further comprising: setting baseline current values for the first gradient coil, the second gradient coil, and the third gradient coil based on designating the shimming configuration for the MRI system.

Clause 9: The method of any of Clause 1-8, wherein the MR system further comprises a radiofrequency (RF) coil, and wherein applying, for each candidate shimming configuration, the pulse sequence comprises: modifying the magnetic field $B_0$ in a first manner by applying current to the first gradient coil according to the candidate shimming configuration; modifying the magnetic field $B_0$ in a second manner by applying current to the second gradient coil according to the candidate shimming configuration; modifying the magnetic field $B_0$ in a third manner by applying current to the third gradient coil according to the candidate shimming configuration; and generating, by the RF coil, an RF pulse to induce the MR signal.

Clause 10: The method of Clause 9, wherein generating the RF pulse to induce the MR signal comprises generating a spin-echo pulse sequence.

Clause 11: The method of any of Clauses 1-10, wherein applying, for each candidate shimming configuration, the pulse sequence comprises applying, for each candidate shimming configuration, at least two pulse sequences, and wherein acquiring, for each pulse sequence, the MR signal comprises acquiring at least two MR signals for each candidate shimming configuration, the method further comprising: determining, for each candidate shimming configuration, an average signal bandwidth based on the at least to MR signals acquired for the candidate shimming configuration.

Clause 12: A system, comprising: an array of permanent magnets configured to generate a low-field strength magnetic field $B_0$ toward an object of interest located within a field of view; a radio frequency (RF) coil assembly comprising an array of RF coils, wherein the RF coils are positionable around an object of interest in the field of view, and wherein the RF coils are configured to acquire magnetic resonance signals; a first gradient coil configured to modify the magnetic field $B_0$ in a first direction based receiving a first current; a second gradient coil configured to modify the magnetic field $B_0$ in a second direction based receiving a second current; a third gradient coil configured to modify the magnetic field $B_0$ in a third direction based receiving a third current; and a control circuit comprising a processor and a memory, wherein the memory stores instructions executable by the processor to apply the first current, the second current, and the third current according to a predetermined shimming configuration of the system.

Clause 13: The system of Clause 12, wherein instructions executable by the processor to apply the first current, the second current, and the third current according to the predetermined shimming configuration comprise instructions to apply the first current according to a first baseline current value, apply the second current according to a second baseline current value, and apply the third current according to a third baseline current value.

Clause 14: The system of any of Clause 13, wherein the memory stores instructions executable by the processor to cause the RF coil assembly to apply an RF pulse sequence while applying the first current, the second current, and the third current according to the predetermined shimming configuration of the system.

Clause 15: The system of Clause 14, wherein the memory stores instructions executable by the processor to apply a gradient field via the first gradient coil by applying the first current according to a value greater than the first baseline current value.

Clause 16: A method of operating a magnet resonance imaging (MRI) system, the MRI system comprising a radiofrequency (RF) coil, a first gradient coil, a second gradient coil, a third gradient coil, and a permanent magnet, wherein the permanent magnet is configured to generate a magnetic field $B_0$ having a low field strength, the method comprising: modifying the magnetic field $B_0$ by concurrently applying a first baseline current to the first gradient coil, applying a second baseline current to the second gradient coil, and applying a third baseline current to the third gradient coil; applying, by the RF coil, an excitation pulse to an object of interest;

generating, by the first gradient coil, a gradient field by applying a current greater than the first baseline current to the first gradient coil; and detecting, by the RF coil, a magnetic resonance (MR) signal induced by the applying the excitation pulse.

Clause 17: The method of Clause 16, wherein modifying the magnetic field $B_0$ by concurrently applying the first baseline current to the first gradient coil, applying the second baseline current to the second gradient coil, and applying the third baseline current to the third gradient coil increases a homogeneity of the magnetic field $B_0$.

Clause 18: The method of any of Clause 16-17, further comprising determining the first baseline current, the second baseline current, and the third baseline current by: selecting a set of candidate shimming configurations, where each of the candidate shimming configurations comprises: a first current corresponding to the first gradient coil; a second current corresponding to the second gradient coil; and a third current corresponding to the third gradient coil; acquiring a set of MR signals based on the set of candidate shimming configurations, wherein each of the MR signals corresponds to one of the candidate shimming configurations; determining a set of signal bandwidths based on the set of MR signals, wherein each of the signals bandwidths is determined based on a frequency domain of a corresponding one of the MR signals; and selecting the first baseline current, the second baseline current, and the third baseline current based on a candidate shimming configuration of the set of candidate shimming configurations corresponding to a narrowest signal bandwidth of the set of signal bandwidths.

While several forms have been illustrated and described, it is not the intention of Applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, and/or examples can be implemented, individually and/or collectively, by a wide range of hardware, software, firmware, or virtually any combination thereof. Those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as one or more program products in a variety of forms, and that an illustrative form of the subject matter described herein applies regardless of the particular type of signal bearing medium used to actually carry out the distribution.

Instructions used to program logic to perform various disclosed aspects can be stored within a memory in the system, such as dynamic random access memory (DRAM), cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, compact disc, read-only memory (CD-ROMs), and magneto-optical disks, read-only memory (ROMs), random access memory (RAM), erasable programmable read-only memory (EPROM), electrically erasable programmable read-only memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the non-transitory computer-readable medium includes any type of tangible machine-readable medium suitable for storing or transmitting electronic instructions or information in a form readable by a machine (e.g., a computer).

As used in any aspect herein, the term "control circuit" may refer to, for example, hardwired circuitry, programmable circuitry (e.g., a computer processor including one or more individual instruction processing cores, processing unit, processor, microcontroller, microcontroller unit, controller, digital signal processor (DSP), programmable logic device (PLD), programmable logic array (PLA), or field programmable gate array (FPGA)), state machine circuitry, firmware that stores instructions executed by programmable circuitry, and any combination thereof. The control circuit may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Accordingly, as used herein "control circuit" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

As used in any aspect herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

As used in any aspect herein, the terms "component," "system," "module" and the like can refer to a control circuit computer-related entity, either hardware, a combination of hardware and software, software, or software in execution.

As used in any aspect herein, an "algorithm" refers to a self-consistent sequence of steps leading to a desired result, where a "step" refers to a manipulation of physical quantities and/or logic states which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities and/or states.

A network may include a packet switched network. The communication devices may be capable of communicating with each other using a selected packet switched network communications protocol. One example communications protocol may include an Ethernet communications protocol which may be capable permitting communication using a Transmission Control Protocol/Internet Protocol (TCP/IP). The Ethernet protocol may comply or be compatible with the Ethernet standard published by the Institute of Electrical and Electronics Engineers (IEEE) titled "IEEE 802.3 Standard", published in December, 2008 and/or later versions of this standard. Alternatively or additionally, the communication devices may be capable of communicating with each other using an X.25 communications protocol. The X.25 communications protocol may comply or be compatible with a standard promulgated by the International Telecommunication Union-Telecommunication Standardization Sector (ITU-T). Alternatively or additionally, the communication devices may be capable of communicating with each other using a frame relay communications protocol. The frame relay communications protocol may comply or be compatible with a standard promulgated by Consultative Committee for International Telegraph and Telephone (CCITT) and/or the American National Standards Institute (ANSI). Alternatively or additionally, the transceivers may be capable of communicating with each other using an Asynchronous Transfer Mode (ATM) communications protocol. The ATM communications protocol may comply or be compatible with an ATM standard published by the ATM Forum titled "ATM-MPLS Network Interworking 2.0" published August 2001, and/or later versions of this standard. Of course, different and/or after-developed connection-oriented network communication protocols are equally contemplated herein.

Unless specifically stated otherwise as apparent from the foregoing disclosure, it is appreciated that, throughout the foregoing disclosure, discussions using terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

One or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

The terms "proximal" and "distal" are used herein with reference to a clinician manipulating the handle portion of the surgical instrument. The term "proximal" refers to the portion closest to the clinician and the term "distal" refers to the portion located away from the clinician. It will be further appreciated that, for convenience and clarity, spatial terms such as "vertical", "horizontal", "up", and "down" may be used herein with respect to the drawings. However, surgical instruments are used in many orientations and positions, and these terms are not intended to be limiting and/or absolute.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flow diagrams are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect. Furthermore, the particular features, structures or characteristics may be combined in any suitable manner in one or more aspects.

Any patent application, patent, non-patent publication, or other disclosure material referred to in this specification and/or listed in any Application Data Sheet is incorporated by reference herein, to the extent that the incorporated materials is not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

What is claimed is:

1. A method of active shimming for a magnet resonance imaging (MRI) system, the MRI system comprising a first gradient coil, a second gradient coil, a third gradient coil, and a permanent magnet, wherein the permanent magnet is configured to generate a magnetic field $B_0$ having a low field strength, the method comprising:

selecting a set of candidate shimming configurations, wherein the set of candidate shimming configurations is a first set of candidate shimming configurations, wherein the set of candidate shimming configurations comprises first current values associated with the first gradient coil from a first range of current values, second current values associated with the second gradient coil from a second range of current values, and third current values associated with the third gradient coil from a third range of current values;

applying, for each candidate shimming configuration, a pulse sequence;

acquiring, for each pulse sequence, a magnetic resonance (MR) signal;

determining, for each MR signal, a signal bandwidth based on a frequency domain of the MR signal;

designating a shimming configuration for the MRI system, wherein the shimming configuration is based on the candidate shimming configuration corresponding to the narrowest signal bandwidth of the MR signals for the set of candidate shimming configurations; and selecting a second set of candidate shimming configurations based on the candidate shimming configuration corresponding to the narrowest signal bandwidth of the MR signals for the first set of candidate shimming configurations.

2. The method of claim 1, further comprising:

plotting the signal bandwidths for the set of candidate shimming configurations in a three-dimensional array, wherein the three-dimensional array comprises a first dimension comprising the first current values, a second dimension comprising the second current values, and a third dimension comprising the third current values; and determining the candidate shimming configuration corresponding to the narrowest signal bandwidth of the MR signals for the set of candidate shimming configurations based on the three-dimensional array.

3. The method of claim 1, further comprising:

for each candidate shimming configuration of the second set of candidate shimming configurations, applying the pulse sequence, acquiring the MR signal, and determining the signal bandwidth based on the frequency domain of the MR signal; and designating the shimming configuration for the MRI system based on the candidate shimming configuration corresponding to the narrowest signal bandwidth of the MR signals for the second set of candidate shimming configurations.

4. The method of claim 1, wherein selecting the second set of candidate shimming configurations comprises:

selecting a fourth range of current values, a fifth range of current values, and a sixth range of current values based on the candidate shimming configuration corresponding to the narrowest signal bandwidth of the MR signals for the first set of candidate shimming configurations;

wherein the second set of candidate shimming configurations comprises fourth current values associated with the first gradient coil from the fourth range of current values, fifth current values associated with the second gradient coil from the fifth range of current values, and sixth current values associated with the third gradient coil from the sixth range of current values.

5. The method of claim 1, wherein the set of candidate shimming configurations comprises candidate shimming configurations derived based on combining each of the first current values with each of the second current values and each of the third current values.

6. The method of claim 1, wherein the MRI system comprises a dome-shaped housing comprising a head coil, and wherein acquiring the MR signal comprises acquiring the MR signal induced in a phantom positioned within the head coil.

7. The method of claim 1, further comprising:

setting baseline current values for the first gradient coil, the second gradient coil, and the third gradient coil based on designating the shimming configuration for the MRI system.

8. The method of claim 1, wherein the MR system further comprises a radiofrequency (RF) coil, and wherein applying, for each candidate shimming configuration, the pulse sequence comprises:

modifying the magnetic field $B_0$ in a first manner by applying current to the first gradient coil according to the candidate shimming configuration;

modifying the magnetic field $B_0$ in a second manner by applying current to the second gradient coil according to the candidate shimming configuration;

modifying the magnetic field $B_0$ in a third manner by applying current to the third gradient coil according to the candidate shimming configuration; and generating, by the RF coil, an RF pulse to induce the MR signal.

9. The method of claim 8, wherein generating the RF pulse to induce the MR signal comprises generating a spin-echo pulse sequence.

10. The method of claim 1, wherein applying, for each candidate shimming configuration, the pulse sequence comprises applying, for each candidate shimming configuration, at least two pulse sequences, and wherein acquiring, for each pulse sequence, the MR signal comprises acquiring at least two MR signals for each candidate shimming configuration, the method further comprising:

determining, for each candidate shimming configuration, an average signal bandwidth based on the at least two MR signals acquired for the candidate shimming configuration.

11. A method of active shimming for a magnet resonance imaging (MRI) system, the MRI system comprising a first gradient coil, a second gradient coil, a third gradient coil, and a permanent magnet, wherein the permanent magnet is configured to generate a magnetic field $B_0$ having a low field strength, the method comprising:

selecting a set of candidate shimming configurations, wherein the set of candidate shimming configurations comprises first current values associated with the first gradient coil from a first range of current values, second current values associated with the second gradient coil from a second range of current values, and third current values associated with the third gradient coil from a third range of current values, and wherein the set of candidate shimming configurations comprises candidate shimming configurations derived based on combining each of the first current values with each of the second current values and each of the third current values;

applying, for each candidate shimming configuration, a pulse sequence;

acquiring, for each pulse sequence, a magnetic resonance (MR) signal;

determining, for each MR signal, a signal bandwidth based on a frequency domain of the MR signal; and designating a shimming configuration for the MRI system, wherein the shimming configuration is based on the candidate shimming configuration corresponding to the narrowest signal bandwidth of the MR signals for the set of candidate shimming configurations.

12. The method of claim 11, further comprising:

plotting the signal bandwidths for the set of candidate shimming configurations in a three-dimensional array, wherein the three-dimensional array comprises a first dimension comprising the first current values, a second dimension comprising the second current values, and a third dimension comprising the third current values; and determining the candidate shimming configuration corresponding to the narrowest signal bandwidth of the MR signals for the set of candidate shimming configurations based on the three-dimensional array.

13. The method of claim 11, wherein the MRI system comprises a dome-shaped housing comprising a head coil, and wherein acquiring the MR signal comprises acquiring the MR signal induced in a phantom positioned within the head coil.

14. The method of claim 11, further comprising:

setting baseline current values for the first gradient coil, the second gradient coil, and the third gradient coil based on designating the shimming configuration for the MRI system.

15. The method of claim 11, wherein the MR system further comprises a radiofrequency (RF) coil, and wherein applying, for each candidate shimming configuration, the pulse sequence comprises:

modifying the magnetic field $B_0$ in a first manner by applying current to the first gradient coil according to the candidate shimming configuration;

modifying the magnetic field $B_0$ in a second manner by applying current to the second gradient coil according to the candidate shimming configuration;

modifying the magnetic field $B_0$ in a third manner by applying current to the third gradient coil according to the candidate shimming configuration; and generating, by the RF coil, an RF pulse to induce the MR signal.

16. The method of claim 15, wherein generating the RF pulse to induce the MR signal comprises generating a spin-echo pulse sequence.

17. The method of claim 11, wherein applying, for each candidate shimming configuration, the pulse sequence comprises applying, for each candidate shimming configuration, at least two pulse sequences, and wherein acquiring, for each pulse sequence, the MR signal comprises acquiring at least two MR signals for each candidate shimming configuration, the method further comprising:

determining, for each candidate shimming configuration, an average signal bandwidth based on the at least two MR signals acquired for the candidate shimming configuration.

18. A method of active shimming for a magnet resonance imaging (MRI) system, the MRI system comprising a first gradient coil, a second gradient coil, a third gradient coil, and a permanent magnet, wherein the permanent magnet is configured to generate a magnetic field $B_0$ having a low field strength, the method comprising:

selecting a set of candidate shimming configurations, wherein the set of candidate shimming configurations comprises first current values associated with the first gradient coil from a first range of current values, second current values associated with the second gradient coil from a second range of current values, and third current values associated with the third gradient coil from a third range of current values;

applying, for each candidate shimming configuration, at least two pulse sequences;

acquiring, for each pulse sequence, at least two magnetic resonance (MR) signals for each candidate shimming configuration;

determining, for each candidate shimming configuration, an average signal bandwidth based on the at least two MR signals acquired for the candidate shimming configuration;

determining, for each MR signal, a signal bandwidth based on a frequency domain of the MR signal; and designating a shimming configuration for the MRI system, wherein the shimming configuration is based on the candidate shimming configuration corresponding to the narrowest signal bandwidth of the MR signals for the set of candidate shimming configurations.

19. The method of claim 18, further comprising:

plotting the signal bandwidths for the set of candidate shimming configurations in a three-dimensional array, wherein the three-dimensional array comprises a first dimension comprising the first current values, a second dimension comprising the second current values, and a third dimension comprising the third current values; and determining the candidate shimming configuration corresponding to the narrowest signal bandwidth of the MR signals for the set of candidate shimming configurations based on the three-dimensional array.

20. The method of claim 18, wherein the MRI system comprises a dome-shaped housing comprising a head coil, and wherein acquiring the MR signal comprises acquiring the MR signal induced in a phantom positioned within the head coil.

21. The method of claim 18, further comprising:

setting baseline current values for the first gradient coil, the second gradient coil, and the third gradient coil based on designating the shimming configuration for the MRI system.

22. The method of claim 18, wherein the MR system further comprises a radiofrequency (RF) coil, and wherein applying, for each candidate shimming configuration, the pulse sequence comprises:

modifying the magnetic field $B_0$ in a first manner by applying current to the first gradient coil according to the candidate shimming configuration;

modifying the magnetic field $B_0$ in a second manner by applying current to the second gradient coil according to the candidate shimming configuration;

modifying the magnetic field $B_0$ in a third manner by applying current to the third gradient coil according to the candidate shimming configuration; and generating, by the RF coil, an RF pulse to induce the MR signal.

23. The method of claim 22, wherein generating the RF pulse to induce the MR signal comprises generating a spin-echo pulse sequence.

* * * * *